(12) United States Patent
Asahara et al.

(10) Patent No.: US 6,983,134 B1
(45) Date of Patent: Jan. 3, 2006

(54) METHOD AND APPARATUS FOR AUTOMATIC FREQUENCY CONTROL AND DEMODULATOR

(75) Inventors: Takashi Asahara, Tokyo (JP); Toshiharu Kojima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/926,556

(22) PCT Filed: Mar. 31, 2000

(86) PCT No.: PCT/JP00/02123

§ 371 (c)(1),
(2), (4) Date: Nov. 19, 2001

(87) PCT Pub. No.: WO01/76097

PCT Pub. Date: Oct. 11, 2001

(51) Int. Cl.
*H04B 1/18* (2006.01)

(52) U.S. Cl. .............................. 455/182.2; 455/192.2; 375/344

(58) Field of Classification Search ............ 455/184.1, 455/179.1, 150.1, 130, 161.1, 170.1, 182.2, 455/192.2; 375/344
See application file for complete search history.

(56) References Cited

U.S. PATENT DOCUMENTS

| | | | | |
|---|---|---|---|---|
| 5,548,811 A | * | 8/1996 | Kumagai et al. | 455/192.2 |
| 5,630,218 A | * | 5/1997 | Muto | 455/226.2 |
| 5,710,796 A | | 1/1998 | Jarvela et al. | |
| 5,751,703 A | * | 5/1998 | Kobayashi et al. | 370/321 |
| 5,999,561 A | * | 12/1999 | Naden et al. | 375/142 |
| 6,408,038 B1 | * | 6/2002 | Takeuchi | 375/341 |
| 6,456,672 B1 | * | 9/2002 | Uchiki et al. | 375/344 |
| 6,590,945 B1 | * | 7/2003 | Brardjanian et al. | 375/340 |
| 6,606,363 B1 | * | 8/2003 | Atarius et al. | 375/362 |

FOREIGN PATENT DOCUMENTS

| | | |
|---|---|---|
| JP | 8-511930 | 12/1996 |
| JP | 9-214569 | 8/1997 |
| JP | 10-51356 | 2/1998 |
| JP | 11-68630 | 3/1999 |
| JP | 11-205092 | 7/1999 |

OTHER PUBLICATIONS

Patent Abstracts of Japan, JP 9-093302, Apr. 4, 1997.

* cited by examiner

*Primary Examiner*—Fan Tsang
*Assistant Examiner*—Matthew Genack
(74) *Attorney, Agent, or Firm*—Oblon, Spivak, McClelland, Maier & Neustadt. P.C.

(57) ABSTRACT

The demodulator of the invention includes a DSP. The DSP determines the distortion amount of the transmission channel based on known signals included in a radio receiving signal, and estimates the frequency of the direct wave based on the distortion amount. Furthermore, the DSP rotates the phase of the distortion amount based on the phase amount corresponding to the estimated frequency of the direct wave. Next, the DSP estimates the center frequency of the Doppler spread based on the distortion amount after the phase is rotated. Furthermore, the DSP synthesizes the phase amount corresponding to the estimated center frequency of the Doppler spread and the phase amount corresponding to the frequency of the direct wave to estimate the last frequency offset. Thereafter, the DSP eliminates frequency offset of the radio receiving signal based on the estimated frequency offset. Thereby, a sufficient frequency offset compensating range can be secured, and excellent BER characteristics can be realized.

14 Claims, 19 Drawing Sheets

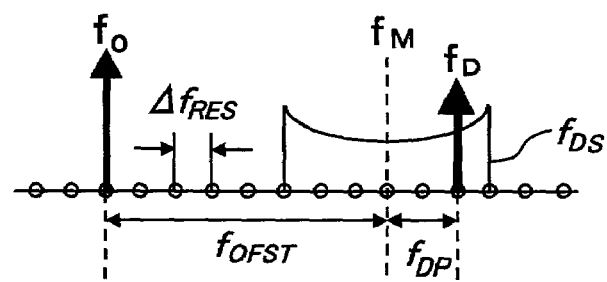
FIG.9A
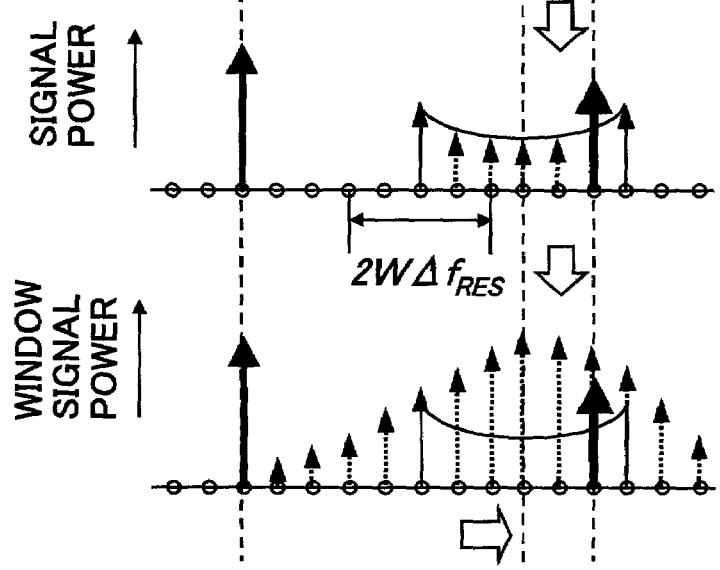
FIG.9B
FIG.9C

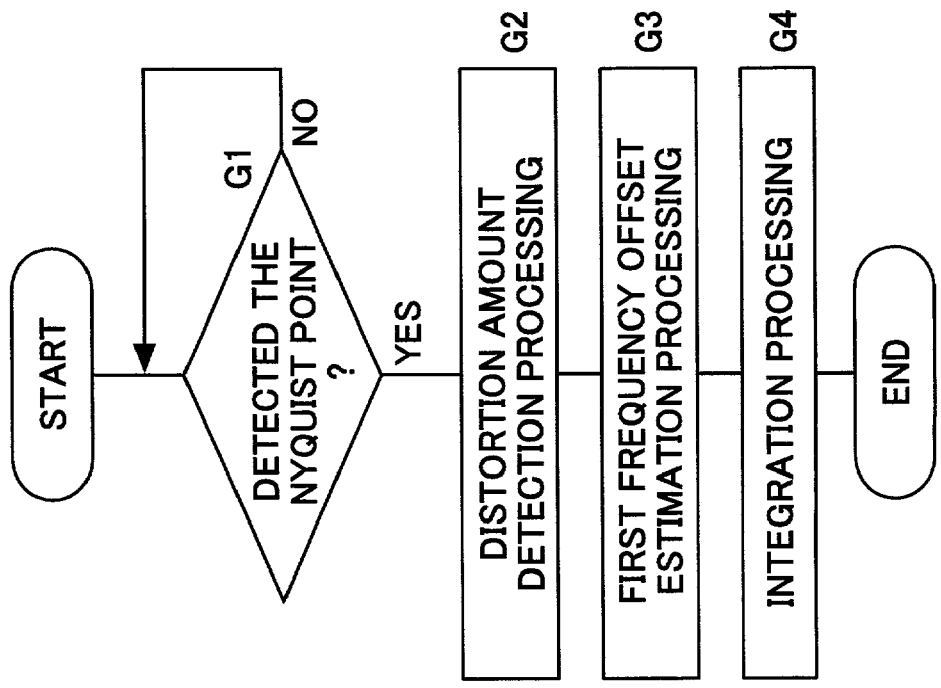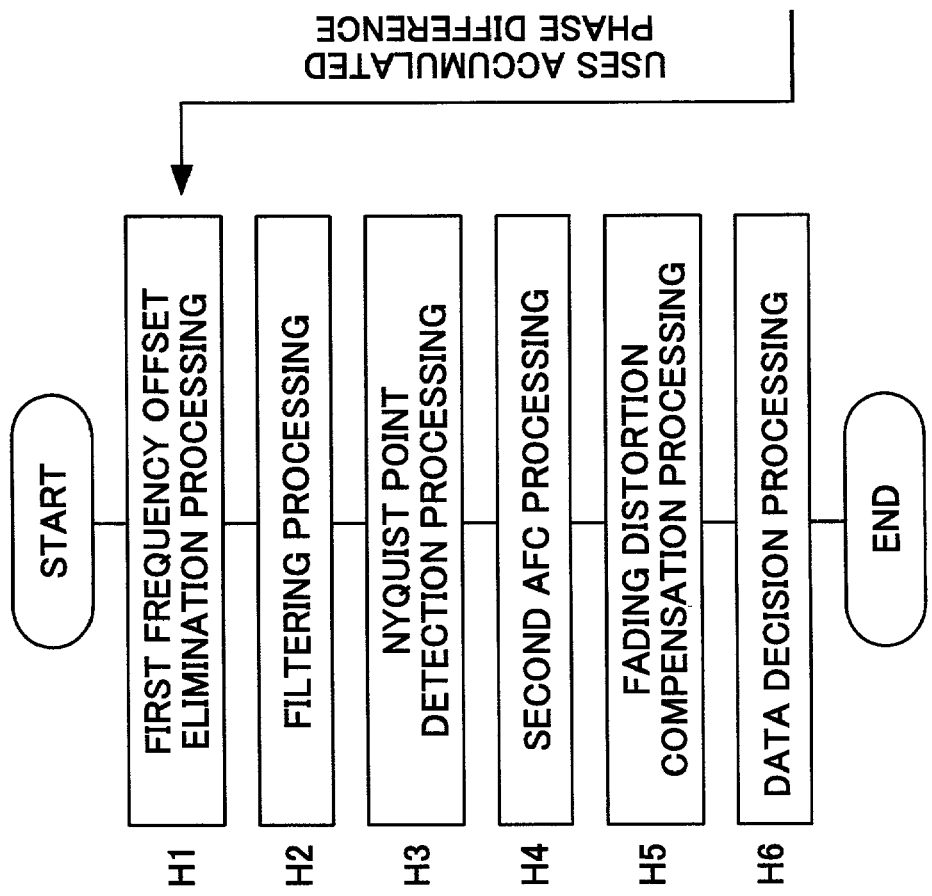

METHOD AND APPARATUS FOR AUTOMATIC FREQUENCY CONTROL AND DEMODULATOR

BACKGROUND OF THE INVENTION

1. Field of the Invention

The present invention relates to an automatic frequency control method and device, which are applied to digital demodulation processing in satellite communication, mobile satellite communication, mobile terrestrial communication, and a demodulator to which said device is applied.

2. Description of the Related Art

Recently, in satellite communication, mobile satellite communication, and mobile terrestrial communication, digital modulation and demodulation have been actively researched. In particular, in the environment of mobile communications, a radio signal is greatly influenced by fading. Therefore, various demodulation systems which stably operate even in such a fading environment have been considered. Among these systems, a system, which is constructed so that absolute coherent detection can be executed even in a fading environment by estimating and compensating fading distortion by using known signals, has been recognized. In the case where fading distortion is estimated and compensated after quasi-coherent detection or the like is carried out by this system, to estimate and compensate fading distortion with high accuracy, it is necessary that the frequency offset between the carrier wave frequency of a radio transmission signal and the oscillation frequency of a reference signal for quasi-coherent detection is small.

However, in the case where the frequency stability and accuracy of the oscillation circuit of a transmitter-receiver are insufficient, unless the frequency of a radio receiving signal is automatically controlled by eliminating this frequency offset by some processing, fading distortion cannot be estimated and compensated with high accuracy.

In mobile communication, transmission and receiving are carried out between a fixed station and a mobile station or between mobile stations. Therefore, when two stations relatively move, the frequency of a radio receiving signal deviates due to Doppler variation. Therefore, even if the stability and accuracy of the oscillation circuit of the transmitter-receiver are good, frequency offset occurs between the frequency of the radio receiving signal and the oscillation frequency of the reference signal.

A technique for compensating frequency offset is disclosed in, for example, Japanese Patent Laid-Open No. 93302/1997 titled "DIGITAL MOBILE RADIO COMMUNICATION METHOD". By the conventional technique disclosed in this document, frequency offset is eliminated by using phase fluctuation information of known signals (pilot signals).

In this conventional technique, a radio transmission signal into which two-symbol known signals have been inserted every inserting period $N_F$ from the transmission side is transmitted. On the other hand, at the receiving side, the phase change amount between the sequential two-symbol known signals is calculated, and in accordance with the calculated phase change amount, the phase of the radio receiving signal is rotated. Frequency offset is thus eliminated from the radio receiving signal.

In electric wave transmission channels, there is a Rician fading transmission channel in which direct waves and multi-path waves are mixed. In this case, the direct wave is Doppler-shifted. Therefore, the frequency $f_D$ of the direct wave further deviates by Doppler-shift amount $f_{DP}$ caused by the Doppler-shifting from the offset $f_{OFST}$ caused by stability of the oscillation circuit as shown in FIG. 24A.

On the other hand, in the abovementioned prior art, the phase change amount between the sequential two-symbol known signals is supposed as frequency offset. The frequency offset calculated in this case is equivalent to the difference between the oscillation frequency $f_O$ at the receiver side and the frequency $f_D$ of the direct wave. That is, in the prior art, as shown in FIG. 24B, frequency control is carried out so that the frequency $f_D$ of the direct wave almost coincides with the oscillation frequency $f_O$. In this case, the center frequency $f_M$ of the Doppler spread deviates from the oscillation frequency $f_O$ by the Doppler-shift amount $f_{DP}$. Therefore, the Doppler spread apparently further broadens, so that the frequency corresponding to the end of the Doppler spread greatly deviates from the oscillation frequency $f_O$. Accordingly, frequency offset cannot be satisfactorily compensated. Therefore, bit error rate characteristics (hereinafter, referred to as BER characteristics) after the radio receiving signal is demodulated may deteriorate.

SUMMARY OF THE INVENTION

The object of the invention is therefore to solve the abovementioned technical problems and provide an automatic frequency control method and device by which satisfactory BER characteristics can be realized without being influenced by a Doppler-shifted direct wave in a Rician fading environment where the direct wave has Doppler-shifted.

Another object of the invention is to provide a demodulator by which demodulation accuracy can be improved by applying the abovementioned automatic frequency control device to this demodulator.

In order to achieve the abovementioned objects, an automatic frequency control method of the invention, which controls the frequency of a radio receiving signal by compensating frequency offset of the radio receiving signal that periodically includes a plurality of adjacent known signals, comprising, based on the distortion amount of each known signal included in the radio receiving signal, the frequency of the direct wave of the radio receiving signal and the center frequency of the Doppler spread of the radio receiving signal are estimated, and based on both of the frequencies, frequency offset of the radio receiving signal is compensated.

In this construction, by compensating the frequency offset based on the frequency of the direct wave, the compensating range of frequency offset can be sufficiently secured, and by compensating the frequency offset based on the center frequency of the Doppler spread, satisfactory BER characteristics can be secured. That is, compatibility with securing of a sufficient frequency offset compensating range and securing of satisfactory BER characteristics can be realized.

In addition, the abovementioned construction is applied to a demodulator, whereby demodulation processing can be executed for a radio receiving signal in which frequency offset has been satisfactorily eliminated. Therefore, the demodulation quality can be improved.

BRIEF DESCRIPTION OF THE DRAWINGS

FIG. 9 is a conception diagram for explanation of the second frequency offset estimation processing;

FIG. 22 is a flowchart for explanation of demodulation processing relating to Embodiment 11 of the invention;

DETAILED DESCRIPTION OF THE PREFFERED EMBODIMENTS

Hereinafter, Embodiments of the invention are explained in detail with reference to the attached drawings.

Embodiment 1

Figure 1:
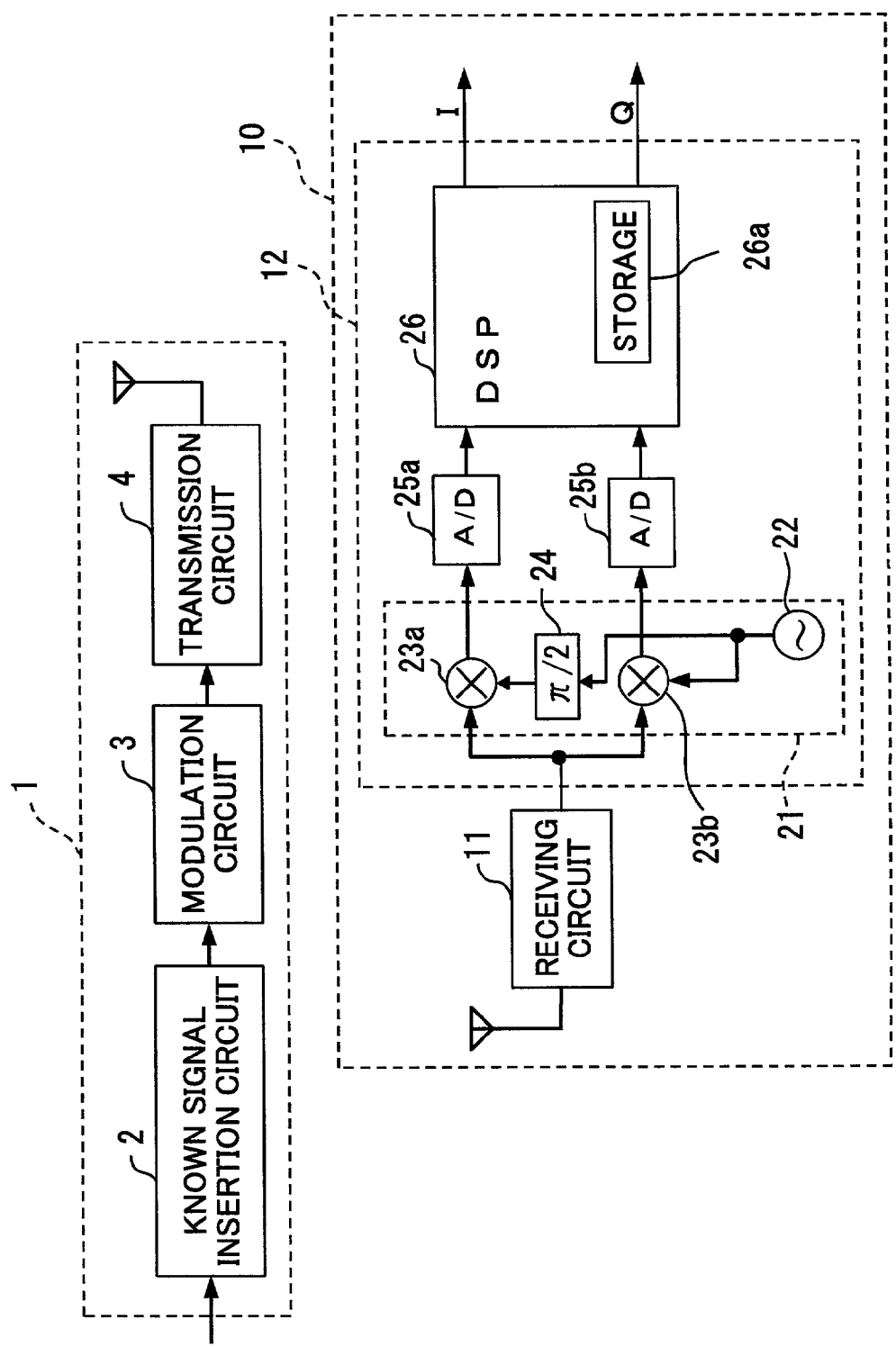
FIG. 1 is a conception diagram showing the entire structure of the radio communication system to which an automatic frequency control method relating to Embodiment 1 of the invention is applied.

FIG. 1 is a block diagram showing the construction of a radio communication system to which an automatic frequency control method relating to Embodiment 1 of the invention is applied. This radio communication system comprises transmitter 1 and receiver 10, and has a function for estimating and eliminating frequency offset of a burst signal radio-transmitted from the transmitter 1 by receiver 10.

Concretely, for this radio communication system, a satellite communication system, mobile satellite communication system, and mobile terrestrial communication system can be applied. In the satellite communication system, transmitter 1 and receiver 10 are applied to earth stations set at different positions on the earth. In the mobile satellite communication system, the transmitter 1 is applied to either an earth station or a mobile station that is set on the earth, and the receiver 10 is applied to an opposite station of the transmitter 1 of the two stations. In the mobile terrestrial communication system, the transmitter 1 is applied to either a base station or a mobile station, and the receiver 10 is applied to an opposite station of the transmitter 1 of the two stations.

As a mobile station in the mobile satellite communication system, a satellite mobile phone of a single mode or a dual mode can be applied. In addition, a cellular phone can be applied to the mobile station in the mobile terrestrial communication system.

This communication system uses the TDMA (Time Division Multiple Access) as a communication method. Therefore, the transmitter 1 radio-transmits a burst signal synchronized with a predetermined time slot to the receiver 10. The receiver 10 demodulates the receiving burst signal, eliminates frequency offset, and then restores the original signal.

Figure 2:
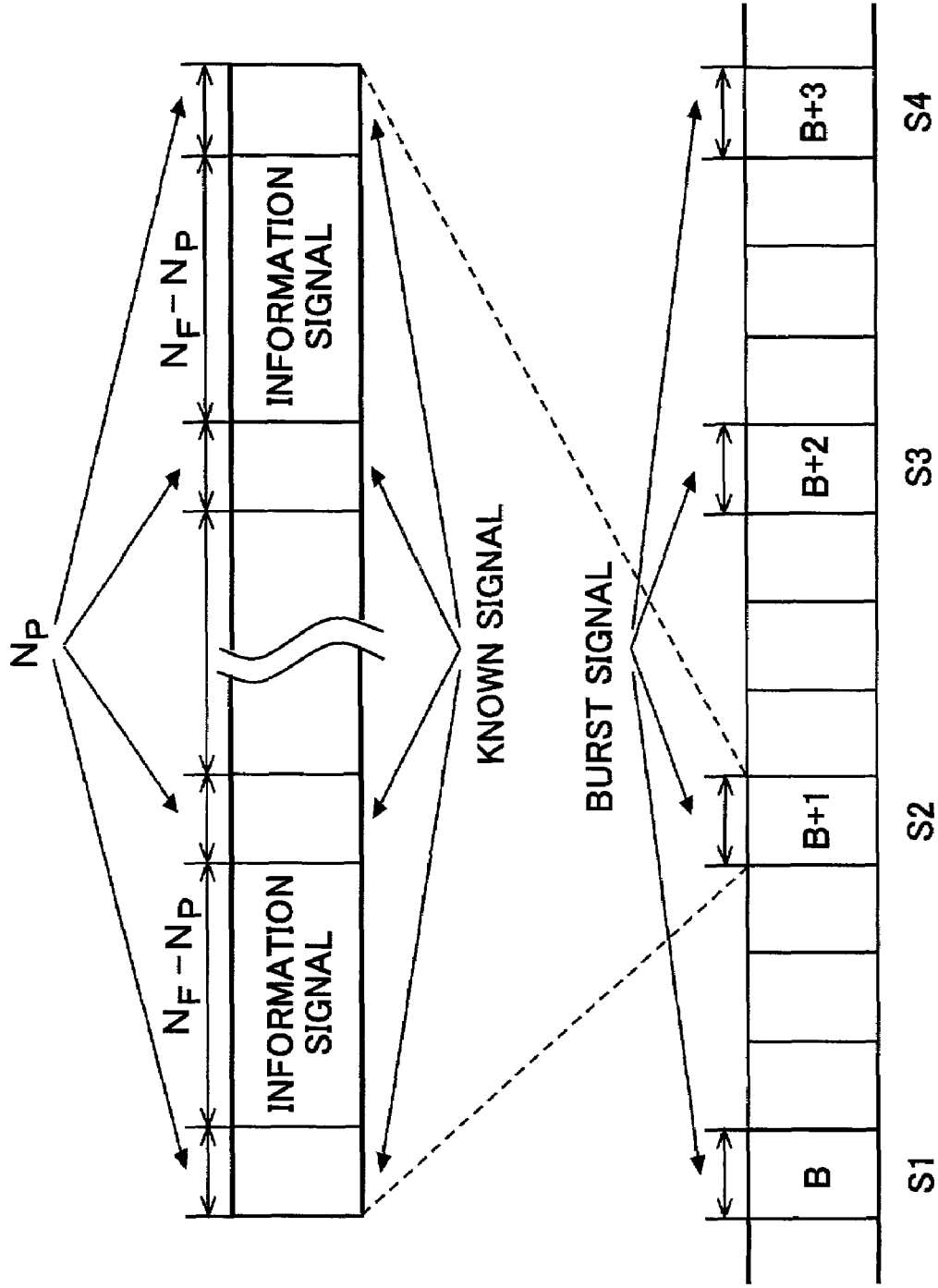
FIG. 2 is a drawing showing the format of a burst signal.

The transmitter 1 comprises known signal insertion circuit 2, modulation circuit 3, and transmission circuit 4. The known signal insertion circuit 2 periodically inserts known signals into information signals to be transmitted, and generates burst signals before modulation. Concretely, as shown in FIG. 2A, the known signal insertion circuit 2 inserts $N_P$-symbol sequential known signal rows (hereinafter, referred to as known signal blocks) into $(N_F-N_P)$-symbol information at every $N_F$-symbol periods. $N_P$ is an integer of 2 or more ($N_P \geq 22$). The timings at which the known signals are inserted are shown by $(kN_F+i)T_S$. Herein, k indicates the insertion order of the known signals. i is a value between zero and $(N_P-1)$ ($0 \leq i \leq N_P-1$). $T_S$ is a symbol period.

The known signal insertion circuit 2 provides a burst signal before being modulated to the modulation circuit 3. The modulation circuit 3 modulates this non-modulated burst signal, and outputs it as a burst signal after being modulated. The modulation circuit 3 synchronizes the modulated burst signal with a predetermined time slot and provides the signal to the transmission circuit 4. Concretely, as shown in FIG. 2B the modulation circuit 3 synchronizes burst signals B, B+1, B+2, B+3 . . . with predetermined time slots S1, S2, S3, S4 . . . and provides the signals to the transmission circuit 4. The transmission circuit 4 superposes the burst signals on electric waves and transmits them to the receiver 10.

The receiver 10 includes receiving circuit 11 and demodulator 12. The receiving circuit 11 is comprised of an amplifier, a frequency converter, and the like, and converts the frequency of the receiving burst signal which is a radio receiving signal into an intermediate frequency and outputs it as a receiving IF signal. The demodulator 12 demodulates the receiving IF signal outputted from the receiving circuit 11 by quasi-coherent detection, and restores the original information signal. More concretely, the demodulator 12 comprises frequency converter circuit 21, two A/D (analog/digital) converter circuits 25a and 25b, and DSP (Digital Signal Processor) 26 as an automatic frequency control device or digital signal processing device, and restores the original information signal by digitally executing demodulation processing by the DSP 26.

The frequency converter circuit 21 converts a receiving IF signal periodically including a plurality of known signals into an analog baseband signal, and the circuit includes one oscillation circuit 22, two multiplication circuits 23a and 23b, and π/2 phase shift circuit 24. The oscillation circuit 22 generates local oscillation signals with a predetermined oscillation frequency. The local oscillation signals generated by the oscillation circuit 22 are inputted into two multiplication circuits 23a and 23b. In this case, the local oscillation signal is inputted into the multiplication circuit 23a for 1 channel via the π/2 phase shift circuit 24. The π/2 phase shift circuit 24 shifts the phases of the local oscillation signals by π/2. Therefore, the local oscillation signals whose phases are shifted by π/2 from each other are inputted into the multiplication circuits 23a and 23b.

The multiplication circuits 23a and 23b each mix the receiving IF signals and the local oscillation signals. As a result, I channel and Q channel analog baseband signals are generated. These generated analog baseband signals are supplied to the A/D converter circuits 25a and 25b respectively. The A/D converter circuits 25a and 25b each convert the analog baseband signals into I channel and Q channel digital baseband signals. The digital baseband signals are supplied to DSP 26 respectively.

The DSP 26 receives the inputs of the digital baseband signals generated by the A/D converter circuits 25a and 25b, and based on the distortion amounts of the known signals included in the inputted digital baseband signals, estimates the frequency of the direct wave and the center frequency of the Doppler spread, and compensates frequency offset based on these estimated frequencies. Thus, the DSP 26 automatically controls the frequencies of the digital baseband signals. Furthermore, the DSP 26 eliminates fading distortion from the digital baseband signals from which frequency offset has been compensated, and then demodulates the digital baseband signals, whereby the original information signals are restored.

More concretely, the DSP 26 has storage 26a comprised of a ROM or the like. In the storage 26a, a demodulation processing program which is a computer program is stored. By executing the demodulation processing program stored in the storage 26a, the DSP 26 executes serial demodulation processing including estimation of the abovementioned two frequencies, compensation for frequency offset, compensation for fading distortion and demodulation.

Figure 3:
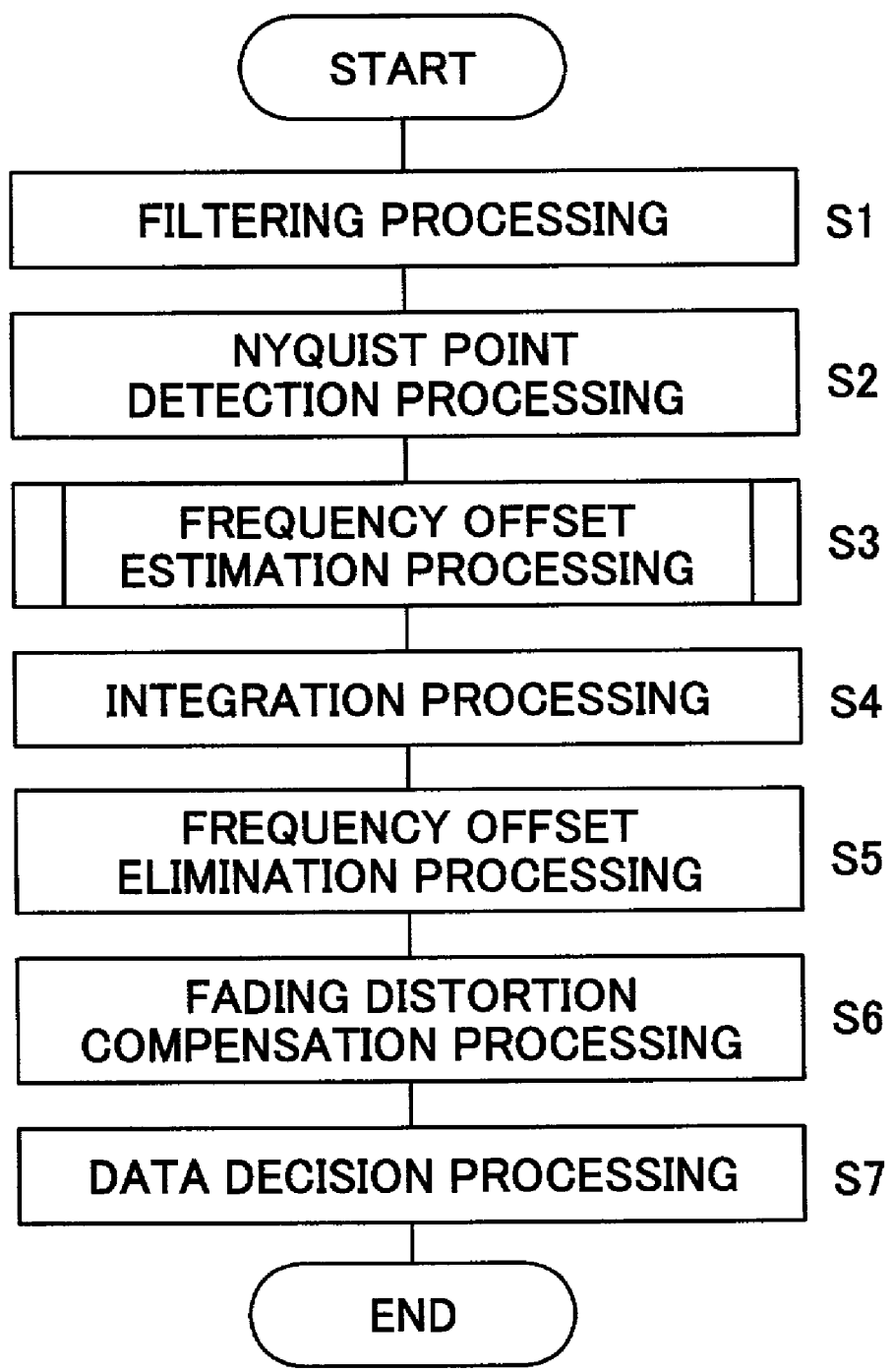
FIG. 3 is a flowchart for explanation of demodulation processing.

FIG. 3 is a flowchart for explanation of the demodulation processing to be executed by the DSP 26. The DSP 26 applies filtering such as waveform shaping processing to the digital baseband signals supplied from the A/D converter circuits 25a and 25b (step S1). Thereby, the DSP 26 eliminates the high frequency components such as noise components higher than a predetermined cutoff frequency from the digital baseband signals.

Thereafter, the DSP 26 executes the Nyquist point detection processing (step S2). Concretely, the DSP 26 detects the Nyquist point of the digital baseband signal to obtain digital baseband signal $r(kN_F+i)$ corresponding to the Nyquist point. The digital baseband signal $r(kN_F+i)$ corresponding to the Nyquist point is expressed as Formula (1) below. In Formula (1) below, $c(kN_F+i)$ shows a distortion amount caused by fading. In addition, A shows the amplitudes of the signals, and $b(kN_F+i)$ shows symbol values. Furthermore, $n(kN_F+i)$ shows gauss noises.

$$r(kN_F+i)=Ac(kN_F+i)b(kN_F+i)+n(kN_F+i) \quad (1)$$

Thereafter, the DSP 26 executes automatic frequency control processing (Step S3 through S5). In the automatic frequency control processing, frequency offset based on the oscillation frequency $f_O$ of the oscillation circuit 22 as a reference is estimated, and the estimated frequency offset is eliminated from the digital baseband signal $r(kN_F+i)$, whereby the frequency of the digital baseband signal $r(kN_F+i)$ is automatically controlled. In other words, the DSP 26 estimates the frequency of the direct wave and the center frequency of the Doppler spread based on the distortion amounts of the plurality of known signals periodically included in the digital baseband signal corresponding to the radio receiving signal, compensates the frequency offset of the digital baseband signal $r(kN_F+i)$ based on both the abovementioned frequency, and thereby automatically controls the frequencies of the digital baseband signal $r(kN_F+i)$.

Further in other words, the DSP 26 estimates frequency offset of the digital baseband signal $r(kN_F+i)$ from the frequency of the direct wave and the center frequency of the Doppler spread that are estimated based on the distortion amounts of the plurality of known signals periodically included in the digital baseband signal $r(kN_F+i)$ corresponding to a radio receiving signal, eliminates the estimated frequency offset from the digital baseband signal $r(kN_F+i)$, whereby the frequency of the digital baseband signal $r(kN_F+i)$ is automatically controlled.

More concretely explaining the automatic frequency control processing, the DSP 26 executes frequency offset estimation processing first (step S3). More specifically, the DSP 26 estimates a phase difference $\theta_S(mLN_F)$ corresponding to the phase rotation amount of one symbol as frequency offset based on the digital baseband signal $r(kN_F+i)$. Still more specifically, the DSP 26 determines a phase difference $\theta_S(mLN_F)$ as frequency offset at each estimating time mT (m: natural number) that comes after each estimating period $T (=LN_FT_S)$ (see FIG. 4) based on the distortion amounts of the plurality of known signals included in the digital baseband signal $r(kN_F+i)$.

Next, the DSP 26 executes integration processing for integrating the determined phase difference $\theta_S(mLN_F)$ by one-symbol period $T_S$ (step S4). Concretely, the DSP 26 cyclically sums phase differences $\theta_S(mLN_F)$ at each symbol period $T_S$ as shown in Formula (2) below. Thereby, the DSP 26 obtains an accumulated phase difference $\theta((m-1)LN_F+lN_F+i)$. In Formula (2) below, l indicates identification numbers corresponding one to one known signal blocks, and is a value of 0 or more and (L-1) or less ($0 \leq l \leq L-1$). L shows the number of known signal blocks included in the estimating period T.

$$\theta((m-1)LN_F+lN_F+i)=\theta((m-1)LN_F+lN_F+i-1)+\theta_S(mLN_F) \quad (2)$$

Thereafter, the DSP 26 executes frequency offset elimination processing for eliminating frequency offset from the digital baseband signal $r(kN_F+i)$ based on this accumulated phase difference $\theta((m-1)LN_F+lN_F+i)$ (step S5). Concretely, the DSP 26 rotates in reverse the phase of the digital baseband signal $r(kN_F+i)$ by an amount in accordance with the accumulated phase difference $\theta((m-1)LN_F+lN_F+i)$. Thereby, frequency offset can be eliminated from the digital baseband signal $r(kN_F+i)$. That is, as shown in Formula (3) below, the DSP 26 obtains a digital baseband signal $r_R(kN_F+i)$ in which frequency offset has been eliminated. Thus, the DSP 26 automatically controls the frequency of the digital baseband signal.

$$r_R(kN_F + i) = r_R((m-1)LN_F + 1N_F + i) \quad (3)$$
$$= r((m-1)LN_F + 1N_F + i)\exp[-j\theta((m-1)LN_F + 1N_F + i)]$$

Thereafter, the DSP 26 executes fading distortion compensation processing for estimating and eliminating fading distortion from the digital baseband signal $r_R(kN_F+i)$ (step S6). Concretely, the DSP 26 extracts $N_P$-symbol known signals from the digital baseband signal $r_R(kN_F+i)$. The frequency offset caused by the transmitter 1 and receiver 10 has been already eliminated from these extracted known signals.

The DSP 26 detects fading distortion based on the extracted $N_P$-symbol known signals. The DSP 26 executes interpolation processing such as gauss interpolation, Wiener interpolation, based on the detected fading distortion. The DSP 26 thus estimates fading distortion in the information signal. Furthermore, the DSP 26 eliminates the estimated fading distortion. Thereby, the DSP 26 executes fading interpolation for the digital baseband signal $r_R(kN_F+i)$.

Thereafter, the DSP 26 executes data decision processing (step S7). Concretely, the DSP 26 dicides the original information signal based on the digital baseband signal in which fading has been compensated. Thus, the demodulation processing is completed.

Figure 5:
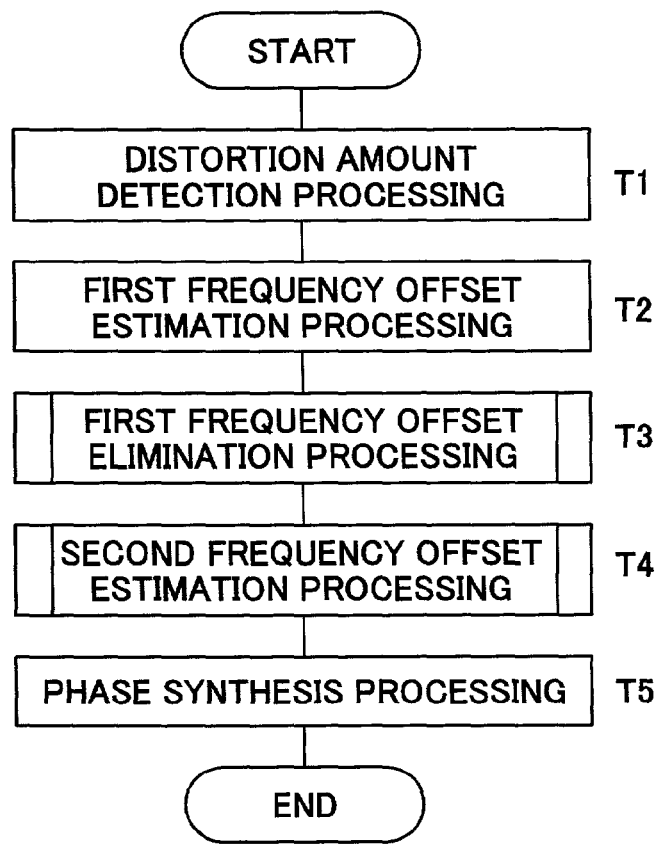
FIG. 5 is a flowchart for explanation of a frequency offset estimation processing.

FIG. 5 is a flowchart for explanation of the frequency offset estimation processing. This frequency offset estimation processing includes the first frequency offset estimation processing and the second frequency offset estimation processing. That is, the DSP 26 estimates frequency offset by combining the first frequency offset estimation processing and the second frequency offset estimation processing.

In the first frequency offset estimation processing, the frequency of the direct wave of the radio receiving signal is estimated as the first frequency offset. In the second frequency offset estimation processing, the center frequency of the Doppler spread of the radio receiving signal is estimated as the second frequency offset. The DSP 26 estimates the last frequency offset from the first and second frequency offsets estimated by these two frequency offset estimation processings.

Figure 24A:
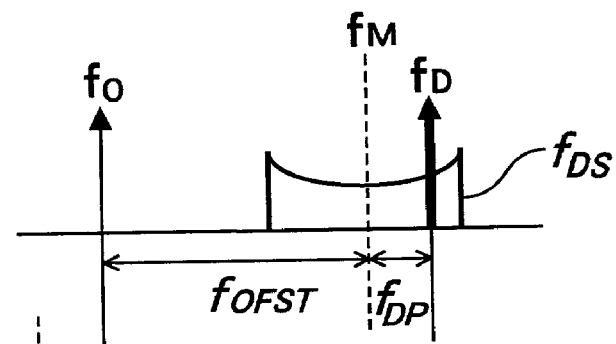
FIG. 24 is a conception diagram for explanation of the relationship of the frequency offset estimating range, estimation accuracy, and possible frequency offset.
Figure 24B:
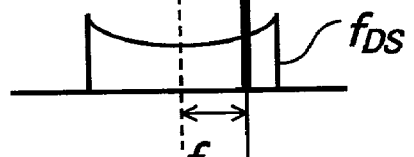
Figure 24C:
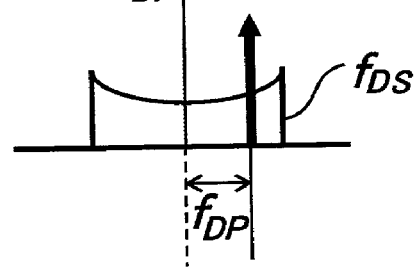

Thus, the reason why the two frequency offset estimation processings are combined is as follows. As explained in the subsection "Description of the Related Art", in the case where the frequency $f_D$ of the direct wave is regarded as frequency offset and compensated, as shown in FIG. 24B, the Doppler spread apparently further broadens, and the BER characteristics deteriorate. On the other hand, in the case where the center frequency $f_M$ of the Doppler broadening is regarded as frequency offset and compensated, as shown in FIG. 24C, the direct wave has frequency deviation corresponding to the Doppler shift amount $f_{DF}$, however, the Doppler spread is left at the original degree of broadening. Therefore, in this case, the deterioration of the BER characteristics is less than that in the case where the frequency $f_D$ of the direct wave is regarded as frequency offset and compensated.

Figure 6:
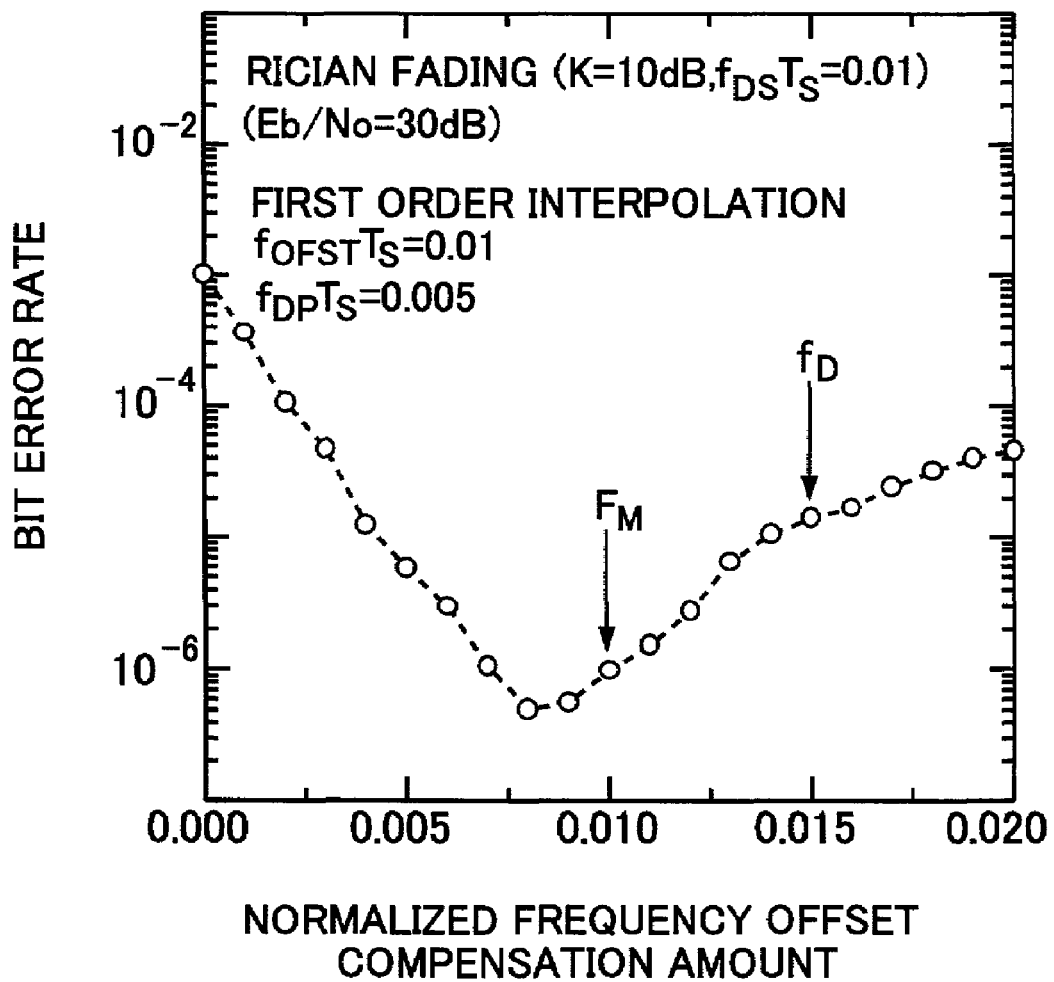
FIG. 6 is a graph showing BER characteristics.

FIG. 6 is a graph showing the BER characteristics. As can be clearly understood from this graph, at the point where the compensation for a frequency close to the center frequency $f_M$ of the Doppler spread suppresses the deterioration of the BER characteristics more greatly than in the case where the frequency $f_D$ of the direct wave is compensated, it is understood that the center frequency $f_M$ is the optimum frequency offset. That is, in terms of prevention of deterioration in the BER characteristics, it can be said that the center frequency $f_M$ of the Doppler spread being regarded as the frequency offset is better than the frequency $f_D$ of the direct wave being regarded as the frequency offset.

On the other hand, in the case where the center frequency $f_M$ of the Doppler spread is regarded as frequency offset and compensated, prevention of deterioration in the BER characteristics is possible, however, there is a problem where the frequency offset compensating range is relatively narrow. On the other hand, in the case where the frequency $f_D$ of the direct wave is regarded as frequency offset and compensated, a relatively wide frequency offset compensating range can be secured.

Concretely, on supposition that the phase rotates by $\Delta\theta$ in a certain time $\Delta t$, the frequency offset $\Delta f$ can be expressed by Formula (4) below.

$$\Delta f = \frac{1}{2\pi}\frac{\Delta\theta}{\Delta t} \quad (4)$$

When this frequency offset $\Delta f$ is estimated by using the phase rotation amount between the known signals, the offset can be expressed by Formula (5) below. In Formula (5) below, $\Delta\theta_P$ shows the phase rotation amount between the known signals. In addition, $R_S$(symbol/s) shows the transmission rate of the signals.

$$\Delta f = \frac{1}{2\pi}\frac{\Delta\theta}{\Delta t} = \frac{1}{2\pi}\frac{R_S}{N_F}\Delta\theta_P \quad (5)$$

The detecting range of the phase rotation amount $\Delta\theta_P$ is $-\pi \leq \Delta_P\theta \leq \pi$, and as a result, the estimating possible range of the frequency offset $\Delta f$ can be expressed by Formula (6) below.

$$-\frac{R_S}{2N_F} \leq \Delta f \leq \frac{R_S}{2N_F} \quad (6)$$

When the frequency $f_D$ of the direct wave is estimated, since the phase rotation amount between the adjacent known signals is used, the $f_D$ becomes equivalent to the value obtained by Formula (6) upon substituting 1 for $N_F$. That is, the frequency offset estimating range $f_{DET1}$ in the first frequency offset estimation processing becomes a range between $-R_S/2$ and $R_S/2$.

In addition, when the center frequency $f_M$ of the Doppler spread is estimated, since the phase rotation amount between the known signal blocks inserted for each $N_F$ symbol is used, the frequency offset estimating range $f_{DET2}$ becomes the same as the range expressed by the abovementioned Formula (6). That is, the frequency offset estimating range $f_{DET2}$ in the second frequency offset estimation processing becomes the range between $-R_S/2N_F$ and $R_S/2N_F$.

Thus, it is understood that the frequency offset estimating range $f_{DET1}$ in the first frequency offset estimation processing is $N_F$ times larger than that in the second frequency offset estimation processing. That is, in the first frequency offset estimation processing, the frequency offset can be estimated in the relatively wide frequency offset estimating range $f_{DET1}$ From the above description, in this Embodiment 1, both of the frequency $f_D$ of the direct wave and the center frequency $f_M$ of the Doppler spread are estimated, and both of these frequencies $f_D$ and $f_M$ are used for compensation for the frequency offset, whereby deterioration in the BER characteristics can be prevented while securing a sufficient frequency offset compensating range.

Hereinafter, the frequency offset estimation processing is explained in detail. The DSP 26 executes distortion amount detection processing first (step T1). In the distortion amount detection processing, the distortion amounts of the transmission channel are detected in symbol units based on the known signals. That is, as shown by Formula (7) below, based on the $N_P$-symbol known signal blocks included in the digital baseband signal $r(kN_F+i)$, the DSP 26 detects the distortion amounts $c_{EPi}(kN_F+i)$ of the transmission channel for each symbol in the known signal blocks. In this case, the distortion amounts $c_{EPi}(kN_F+i)$ of the transmission channel corresponding to the amplitude and the distortion amount of the phase of the digital baseband signal $r(kN_F+i)$. In addition, in Formula (7) below, $b_P$ shows the symbol value of the known signal.

$$c_{EPi}(kN_F + i) = \frac{r(kN_F + i)}{b_P} \quad (7)$$

$$= Ac(kN_F + i) + \frac{n(kN_F + i)}{b_P}$$

Thereafter, the DSP 26 executes the first frequency offset estimation processing based on the detected distortion amounts $c_{EPi}(kN_F+i)$ of the transmission channel (step T2). Concretely, the DSP 26 estimates the frequency of the direct wave as the first frequency offset based on the distortion amounts $c_{EPi}(kN_F+i)$ of the transmission channel. More concretely, the DSP 26 estimates the phase difference $\theta_{EP1}(mLN_F)$ corresponding to the phase rotation amount between the adjacent known signals as the first frequency offset based on the distortion amount $c_{EPi}(kN_F+i)$ between the adjacent known signals among distortion amounts $c_{EPi}(kN_F+i)$ of the transmission channel.

Thereafter, the DSP 26 executes frequency offset elimination processing for eliminating the first frequency offset from the distortion amount of each known signal based on the estimated phase difference $\theta_{EP1}(mLN_F)$ (step T3). More concretely, the DSP 26 compensates the phase by rotating the phases of the distortion amounts $c_{EPi}(kN_F+i)$ of the transmission channel by the phase difference $\theta_{EP1}(mLN_F)$ as shown by Formula (8). Thereby, the DSP 26 obtains the distortion amounts $c_{EP1}(kN_F+i)$ in which the first frequency offset has been eliminated.

$$c_{EP1}(kN_F+i) = c_{EPi}(kN_F+i) \exp[-j\theta(kN_F+i)] \; \theta(kN_F+i) = \theta(kN_F+i-1) + \theta_{EP1}(mLN_F) \quad (8)$$

Thereafter, the DSP 26 executes the second frequency offset estimation processing (step T4). Concretely, the DSP 26 estimates the second frequency offset based on the distortion amounts $c_{EP1}(kN_F+i)$ in which the first frequency offset has been eliminated. More concretely, the DSP 26 estimates the phase difference $\theta_{EP2}(mLN_F)$ corresponding to the phase rotation amount for one symbol as the second frequency offset based on the distortion amount of the periodically inserted known signals among the distortion amounts $c_{EP1}(kN_F+i)$ in which the first frequency offset has been eliminated.

Thereafter, the DSP 26 executes phase synthesis processing (step T5). Concretely, the DSP 26 synthesizes the two phase differences $\theta_{EP1}(mLN_F)$ and $\theta_{EP2}(mLN_F)$ as shown by Formula (9) to estimate the phase difference $\theta_S(mLN_F)$ as the last frequency offset.

$$\theta_S(mLN_F) = \theta_{EP1}(mLN_F) + \theta_{EP2}(mLN_F) \quad (9)$$

Figure 7:
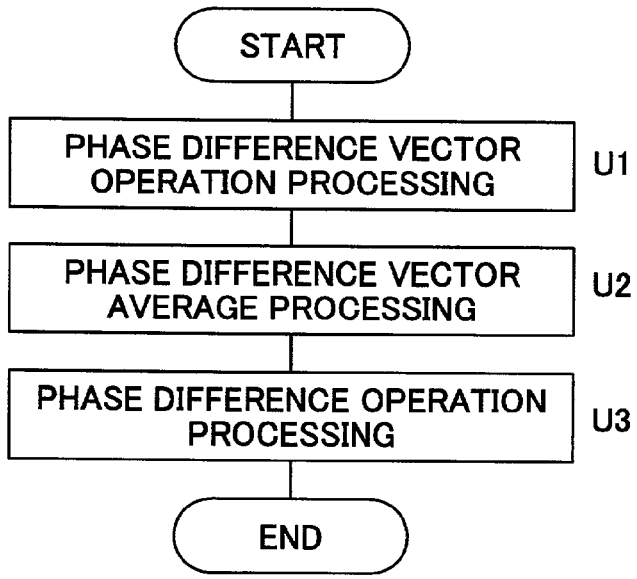
FIG. 7 is a flowchart for explanation of the first frequency offset estimation processing.

FIG. 7 is a flowchart for detailed explanation of the first frequency offset estimation processing. The DSP 26 executes phase difference vector operation processing first (step U1). Concretely, the DSP 26 determines the phase difference vector $D_{EP}(kN_F)$ based on the distortion amounts $c_{EPi}(kN_F+i)$ of the transmission channel. More concretely, as shown by Formula (10) below, based on the distortion amount between the adjacent known signals in an arbitrary known signal block among the distortion amounts $c_{EPi}(kN_F+i)$ of the transmission channel, the DSP 26 determines the phase difference vector $c_{EPi}(kN_F+i)$. In Formula (10) below, i shows the identification numbers corresponding one to one known signals, and are zero or larger and $(N_P-2)$ or smaller $(0 \leq i \leq N_P-2)$. In addition, "*" shows a complex conjugate.

$$D_{EP}(kN_F) = \sum_{i=0}^{N_P-2} c_{EP(i+1)}(kN_F + i + 1)c_{EPi}*(kN_F + i) \quad (10)$$

Thereafter, the DSP 26 executes phase difference vector average processing (step U2). Concretely, the DSP 26 averages the phase difference vectors $D_{EP}(kN_F)$ in arbitrary known signal blocks for the estimation period T to determine the average phase difference vector $D_{EPA}(mLN_F)$.

Figure 4:
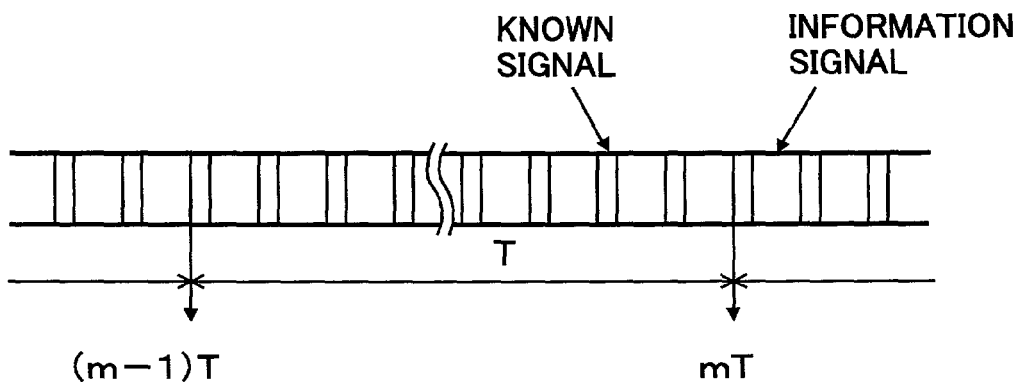
FIG. 4 is a drawing for explanation of estimated timing of a frequency offset.

More concretely, the DSP 26 collects the phase difference vectors $D_{EP}(kN_F)$ in known signal blocks for the estimation period T from the estimation time $(m-1)T$ to the estimation time $mT$ (see FIG. 4). If the number of known signal blocks in the estimation period T is L, the DSP 26 obtains L of phase difference vectors $D_{EP}((m-1)T+lN_F)$. Herein, l shows the identification numbers corresponding one to one known signal blocks, and is 0 or more and $(L-1)$ or less $(0 \leq l \leq L-1)$. Thereafter, as shown by Formula (11) below, the DSP 26 determines the average phase difference vector $D_{EPA}(mLN_F)$ by averaging the collected L of phase difference vectors $D_{EP}((m-1)LN_F+lN_F)$.

$$D_{EPA}(mLN_F) = \sum_{l=0}^{L-1} D_{EP}((m-1)LN_F + lN_F) \quad (11)$$

Then, the DSP 26 executes phase difference operation processing (step U3). Concretely, as shown by Formula (12) below, the DSP 26 determines the phase difference $\theta_{EP1}(mLN_F)$ based on the average phase difference vector $D_{EPA}(mLN_F)$. Thus, the first frequency offset according to the frequency of the direct wave is estimated within the frequency offset estimating range $f_{DET1}$ that is wider than the frequency offset estimating range $f_{DET2}$.

$$\theta_{EPI}(mLN_F) = \tan^{-1} \frac{Im[D_{EPA}(mLN_F)]}{Re[D_{EPA}(mLN_F)]} \quad (12)$$

Figure 8:
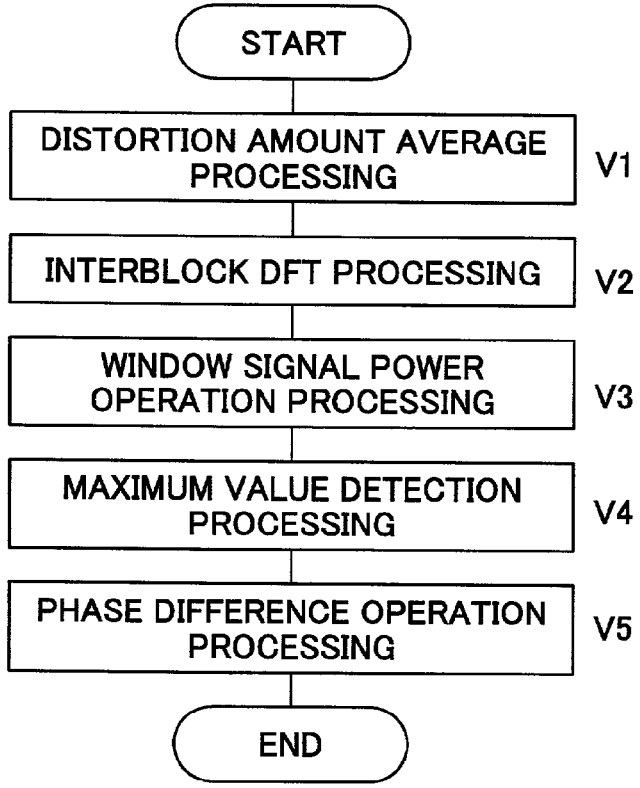
FIG. 8 is a flowchart for explanation of the second frequency offset estimation processing.

FIG. 8 is a flowchart for explanation of the second frequency offset estimation processing. The DSP 26 executes distortion amount average processing first (step V1). Concretely, the DSP 26 applies average processing to the distortion amounts $c_{EP1}(kN_F+i)$ $(0 \leq i \leq N_P-1)$ of the transmission channel in the known signal blocks in which the first frequency offset has been eliminated to determine the average distortion amount $c_{EP}(kN_F)$.

More concretely, as shown by Formula (13) below, the DSP 26 sums the distortion amounts $c_{EP1}(kN_F+i)$ corresponding to each symbol in arbitrary known signal blocks, and divides the summed value by the symbol number $N_P$ of the known signals in the known signal blocks. Thus, the DSP 26 obtains the average distortion amount $c_{EP}(kN_F)$ of the transmission channel with regard to one known signal block in which noise or the like has been eliminated.

$$C_{EP}(kN_F) = \frac{1}{N_P} \sum_{i=0}^{N_P-1} c_{EPI}(kN_F + i) \tag{13}$$

Next, the DSP 26 executes interblock discrete Fourier transform (DFT) processing based on this average distortion amount $c_{EP}(kN_F)$ (step V2). Concretely, the DSP 26 applies DFT processing to the average distortion amounts $c_{EP}((m+1)N_F)$ ($0 \leq l \leq L-1$) in certain L of known signal blocks within the estimation period T (=$LN_F T_S$), and thereby determines signal electric powers $P_f(n)$ corresponding to the plurality of frequency offset candidates $n\Delta f_{RES}$.

More concretely, the DSP 26 determines signal powers $P_f(n)$ corresponding to the plurality of frequency offset candidates $n\Delta f_{RES}$ that are set for each predetermined estimation accuracy $\Delta f_{RES}$ as shown by the circles in FIG. 9A within the frequency offset estimating range $f_{DET2}$. Herein, the frequency offset estimating range $f_{DET2}$, as mentioned above, is regulated by the known signal insertion period $N_F$, and if the estimation accuracies $\Delta f_{RES}$ are used, this range is a range between $-M\Delta f_{RES}$ and $M\Delta f_{RES}$. M is a constant, and is approximately expressed by Formula (14) below.

$$M \cong \frac{R_S}{2N_F \Delta f_{RES}} \tag{14}$$

The DSP 26 rotates the phases of the average distortion amounts $c_{EP}(m+1)N_F$ in the frequency offset estimating range $f_{DET2}$ by the phase amounts corresponding to the respective possible frequency offset candidates $n\Delta f_{RES}$. Thereafter, the DSP 26 vector-synthesizes the average distortion amounts $c_{EP}((m+1) N_F)$ whose phases have been rotated. Thereby, the DSP 26 obtains signal powers $P_f(n)$ corresponding to the plurality of frequency offset candidates $n\Delta f_{RES}$ as shown by the group of arrows in FIG. 9B.

The abovementioned processing can be summarized as Formula (15) below. In Formula (15) below, $R_S$ shows the signal transmission rate, n is a value between $-(M+W)$ and $(M+W)$. In addition, W is a parameter showing the frequency bandwidth of the frequency window described later.

$$P_f(n) = \left| \sum_{l=0}^{L-1} c_{EP}((m+1)N_F) \exp\left(-j \frac{2\pi l N_F n \Delta f_{RES}}{R_S}\right) \right|^2 \tag{15}$$

Thereafter, the DSP 26 executes window signal power operation processing (step V3). Concretely, the DSP 26 determines the window signal powers $E_f(n)$ that correspond one to one frequency windows having predetermined frequency widths. For example, the frequency width of a frequency window is 2W times of the estimation accuracy $\Delta f_{RES}$. W is set in accordance with the fading condition of the transmission channel, and is set to be, for example, two times of the Doppler spread. As shown by Formula (16) below, the DSP 26 sums the signal powers $P_f(n)$ of the frequency offset candidates $n\Delta f_{RES}$ existing in this frequency window to determine the window signal power $E_f(n)$ corresponding to this frequency window. In Formula (16) below, n is a value between $-M$ and $M$.

$$E_f(n) = \sum_{k=-W}^{W} P_f(n+k) \tag{16}$$

Thus, by smoothing the signal powers $P_f(n)$ by using the frequency windows, among the window signal powers $E_f(n)$ corresponding to the plurality of frequency offset candidates $n\Delta f_{RES}$, as shown in FIG. 9C, the window signal power $E_f(n)$ of the frequency offset candidate $n\Delta f_{RES}$ according to the center frequency of the Doppler spread becomes maximum.

Next, the DSP 26 executes maximum value detection processing (step V4). Concretely, as shown by Formula (17) below, the DSP 26 detects the maximum value among all window signal powers $E_f(n)$, and estimates the frequency offset candidate $n\Delta f_{RES}$ corresponding to the maximum value as the second frequency offset. That is, the DSP 26 estimates the center frequency of the Doppler spread as the second frequency offset.

$$f_{OFST} = n_{MAX} \Delta f_{RES} \tag{17}$$

$$E_f(n_{MAX}) = \max_n [E_f(n)]$$

Next, the DSP 26 executes phase difference operation processing (step V5). Concretely, as shown by Formula (18) below, the DSP 26 determines the phase difference $\theta_{EP2}(mLN_F)$ of one symbol based on the estimated second frequency offset. Thus, the phase difference $\theta_{EP2}(mLN_F)$ corresponding to the center frequency of the Doppler spread is obtained.

$$\theta_{EP2}(mLN_F) = f_{OFST} \times \frac{2\pi}{R_s} \tag{18}$$

As described above, according to this Embodiment 1, by estimating both of the frequency of the direct wave and the center frequency of the Doppler spread, the last frequency offset is estimated. Therefore, a sufficient frequency offset compensating range can be secured, and excellent BER characteristics can be realized. That is, securing of a sufficient frequency offset compensating range and realization of excellent BER characteristics are compatible with each other. Therefore, even under a Rician fading environment, compensation for fading distortion can be satisfactorily carried out. Therefore, the original data can be restored with high quality. Accordingly, service for receiver users can be improved.

Figure 10:
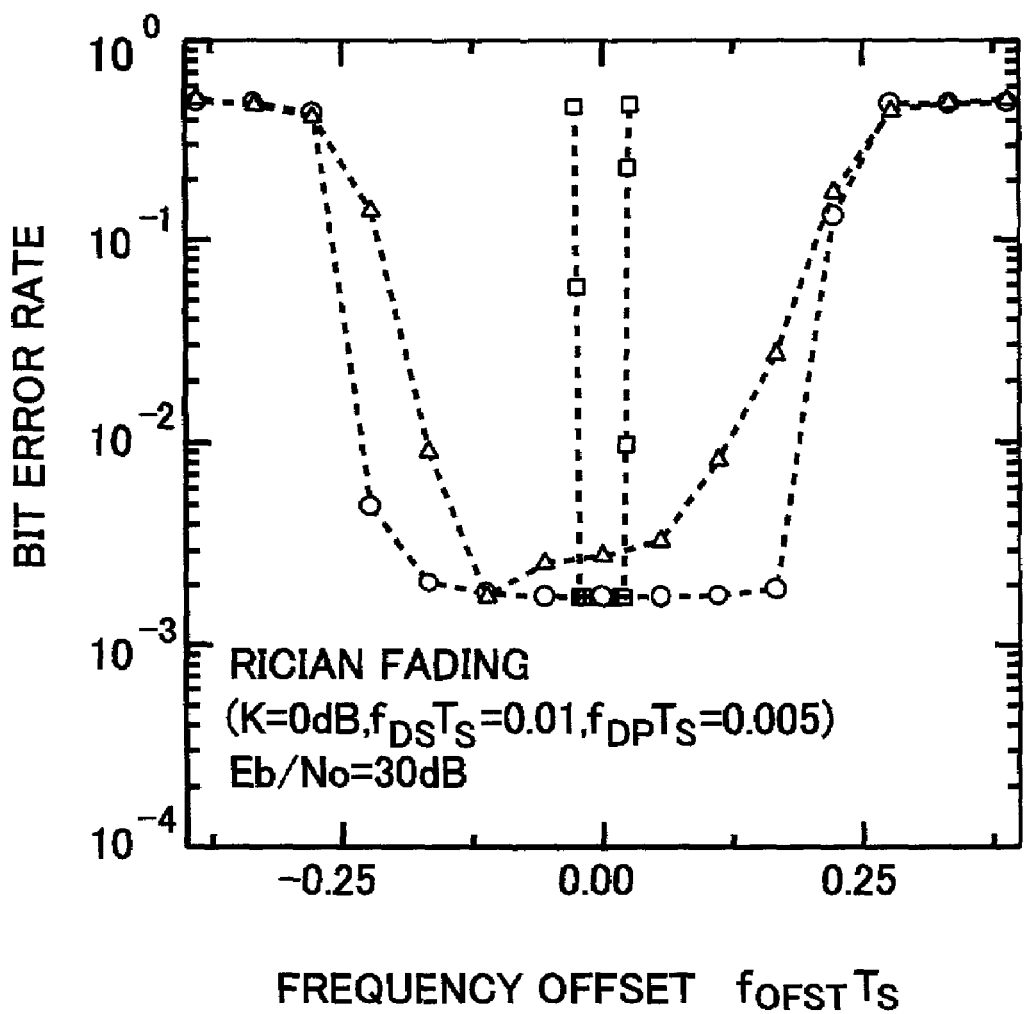
FIG. 10 is a graph for explanation of BER based on Embodiment 1.

FIG. 10 is a graph showing the frequency offset estimated characteristics relating to this Embodiment 1. In this figure, the circles show the BER in the case where the value obtained by synthesizing the frequency of the direct wave and the center frequency of the Doppler spread is regarded as frequency offset as in Embodiment 1. The triangles show the BER when only the frequency of the direct wave is regarded as frequency offset. Furthermore, the squares show the BER when only the center frequency of the Doppler spread is regarded as frequency offset.

As clearly understood from this graph, the BER characteristics relating to Embodiment 1 are more excellent than those in the case where only the frequency of the direct wave is regarded as frequency offset, and a frequency offset compensating range, which is wider than that in the case where only the center frequency of the Doppler spread is regarded as frequency offset, is realized in Embodiment 1.

Furthermore, according to the abovementioned Embodiment 1, frequency offset candidates $n\Delta f_{RES}$ are set for each estimation accuracy $\Delta f_{RES}$, signal powers $P_f(n)$ corresponding to the respective frequency offset candidates $n\Delta f_{RES}$ are determined, and the signal powers $P_f(n)$ are smoothed by using the frequency windows, whereby the second frequency offset is estimated. Therefore, for example, if the estimation accuracies $\Delta f_{RES}$ are finely divided, the estimation accuracy for the second frequency offset can be improved. Accordingly, further excellent BER characteristics can be realized.

Embodiment 2

Figure 11:
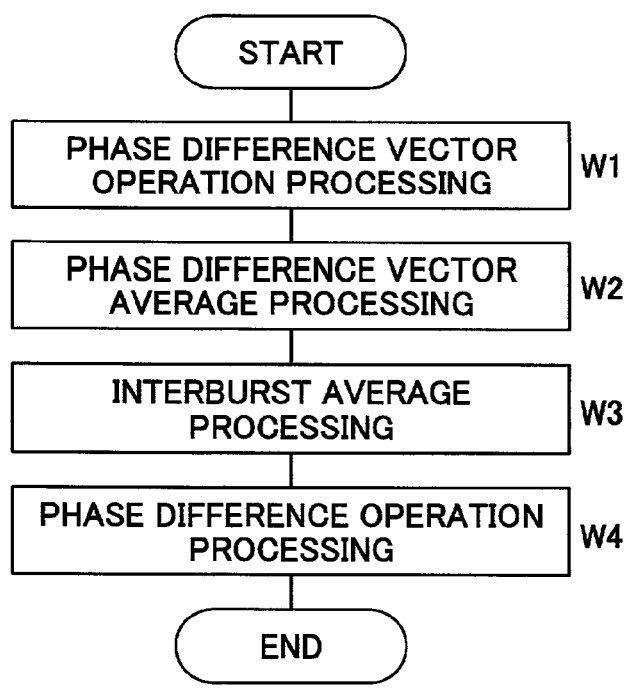
FIG. 11 is a flowchart for explanation of the first frequency offset estimation processing relating to Embodiment 2 of the invention.

FIG. 11 is a flowchart for explanation of the first frequency offset estimation processing relating to Embodiment 2 of the invention.

In the abovementioned Embodiment 1, the phase difference $\theta_{EP1}(mLN_F)$ is determined as the first frequency offset from the average phase difference vector $D_{EPA}(mLN_F)$. On the other hand, in this Embodiment 2, the phase difference $\theta_{EP1}(mLN_F)$ is determined as the first frequency offset by further averaging the average phase difference vectors $D_{EPA}(mLN_F)$ between the receiving burst signals by using a forgetting factor k. Thereby, the estimation accuracy for the frequency offset is improved.

Concretely, the DSP 26 determines the phase difference vectors $D_{EP}(mLN_F)$ (step W1), averages the phase difference vectors $D_{EP}(mLN_F)$ to determine the average phase difference vector $D_{EPA}(mLN_F)$ (step W2), and then executes interburst average processing (step W3). In the interburst average processing, the average phase difference vectors $D_{EPA}(mLN_F)$ are further averaged between the receiving burst signals.

More concretely, the DSP 26 holds the average phase difference vector $D_{EPA}(mLN_F)$ at least until the next receiving burst signal is received. Based on the average phase difference vector $D_{EPA}(mLN_F)$ when the receiving burst signal B is received and the average phase difference vector $<D_{EPA}(mLN_F)>_{B-1}$ when the one previous receiving burst signal (B-1) is received, the DSP 26 determines the average phase difference vector $<D_{EPA}(mLN_F)>_B$ by way of Formula (19) below. In Formula (19), λ is a forgetting factor, and is a value of 0 or more and 1 or less (0≦λ1).

$$\langle D_{EPA}(mLN_F)\rangle_B = D_{EPA}(mLN_F) + \lambda \langle D_{EPA}(mLN_F)\rangle_{B-1} \quad (19)$$

Thereafter, the DSP 26 executes phase difference operation processing based on the average phase difference vector $<D_{EPA}(mLN_F)>_B$ (step W4). Concretely, as shown by Formula (20) below, the DSP 26 determines the phase difference $\theta_{EP1}(mLN_F)$ based on the average phase difference vector $<D_{EPA}(mLN_F)>_B$. Thus, the DSP 26 estimates the first frequency offset coressponding to the frequency of the direct wave.

$$\theta_{EPI}(mLN_F) = \tan^{-1}\frac{\mathrm{Im}[\langle D_{EPA}(mLN_F)\rangle]}{\mathrm{Re}[\langle D_{EPA}(mLN_F)\rangle]} \quad (20)$$

As described above, according to this Embodiment 2, average processing is executed while the previous average phase difference vectors $D_{EPA}(mLN_F)$ are gradually forgotten by using the forgetting factor λ. Therefore, even in the case where the fading condition changes with the times, average processing can be executed for the average phase difference vectors $D_{EPA}(mLN_F)$ while following the time variation. Accordingly, a phase difference vector in conformity with the condition of the transmission path can be obtained. Therefore, even under an environment where the C/N is low and the frequency offset changes with the times, the frequency offset can be estimated with high accuracy.

Embodiment 3

Figure 12:
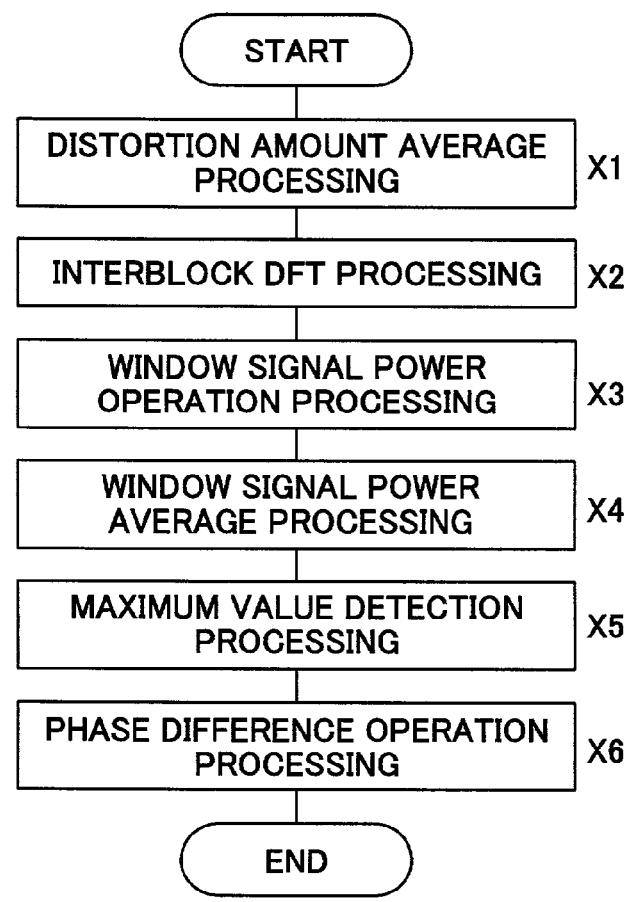
FIG. 12 is a flowchart for explanation of the second frequency offset estimation processing relating to Embodiment 3 of the invention.

FIG. 12 is a flowchart for explanation of the second frequency offset estimation processing relating to Embodiment 3 of the invention.

In the abovementioned Embodiment 1, the maximum value $E_f(n)$ of the signal power is detected among the window signal powers $E_f(n)$ determined by one window signal power operation processing, whereby the second frequency offset is estimated. On the other hand, in this Embodiment 3, after averaging the window signal powers $E_f(n)$ between the receiving burst signals by using the forgetting factor X, the maximum value is detected to estimate the second frequency offset. Thereby, the estimation accuracy of the frequency offset is improved.

Concretely, the DSP 26 determines the average distortion amounts $C_{EP}(kN_F)$ (step X1), and applies interblock DFT processing to the average distortion amounts $C_{EP}(kN_F)$, and thereby determines the signal powers $P_f(n)$ (step X2), and furthermore, determines the window signal powers $E_f(n)$ from the signal powers $P_f(n)$ (step X3), and then executes window signal power average processing (step X4).

More concretely, the DSP 26 holds the window signal power $E_f(n)$ at least until the next receiving burst signal is received. Based on the window signal power $E_f(n)$ when the receiving burst signal B is received and the average window signal power $<E_f(n)>_{B-1}$ when the one previous receiving burst signal (B-1) is received, the DSP 26 determines the average window signal power $<E_f(n)>_B$ by way of Formula (21) below. In Formula (21) below, λ is a forgetting factor between 0 and 1 (0≦λ≦1).

$$\langle E_f(n)\rangle_B = E_f(n) + \lambda \langle E_f(n)\rangle_{B-1} \quad (21)$$

As shown by Formula (22) below, the DSP 26 detects the maximum value $<E_f(n_{max})>_B$ average window signal power among the determined average window signal powers $<E_f(n)>_B$ (step X5).

$$\langle E_f(n_{\mathrm{MAX}})\rangle_B = \mathrm{Max}_n[\langle E_f(n)\rangle_B] \quad (22)$$

Thereafter, the DSP 26 estimates the phase difference $\theta_{EP2}(mLN_F)$ corresponding to the possible frequency offset $n\Delta f_{RES}$ corresponding to this maximum value $<E_f(n_{MAX})>_B$ as the second frequency offset (step X6).

As described above, according to Embodiment 3, average processing is executed while the previous window signal powers are gradually forgotten by using the forgetting factor λ. Therefore, even in the case where the fading condition changes with the times, average processing of the window signal powers can be executed while following the time variation. Accordingly, window signal powers in conformity with the conditions of the transmission channel can be obtained. Therefore, even under an environment where C/N is low and the frequency offset changes with the times, frequency offset can be estimated with high accuracy.

Embodiment 4

Figure 13:
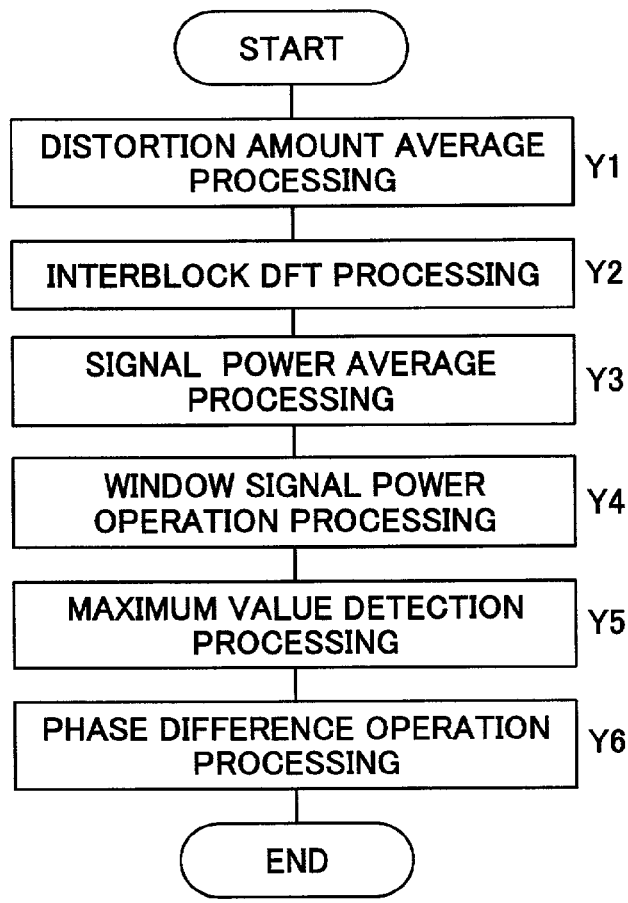
FIG. 13 is a flowchart for explanation of the second frequency offset estimation processing relating to Embodiment 4 of the invention.

FIG. 13 is a flowchart for explanation of the second frequency offset estimation processing relating to Embodiment 4 of the invention.

In Embodiment 3, influences of noise are eliminated by averaging the window signal powers $E_f(n)$, whereby the estimation accuracy of the second frequency offset is improved. On the other hand, improvement in the estimation accuracy of the second frequency offset by eliminating influences of noise can also be achieved by averaging the signal powers $P_f(n)$. Therefore, in this Embodiment 4, the signal powers $P_f(n)$ are averaged between the receiving burst signals to eliminate influences of noise, whereby the estimation accuracy of the second frequency offset is improved.

Concretely, the DSP 26 determines the average distortion amounts $C_{EPA}(kN_F)$ (step Y1) and applies DFT processing to the average distortion amounts $C_{EPA}(kN_F)$ to determine signal powers $P_f(n)$ (step Y2), and then executes signal power average processing (step Y3). More concretely, the DSP 26 holds the signal power $P_f(n)$ at least until the next receiving burst signal is received. Based on the signal power $P_f(n)$ when the receiving burst signal B is received and the average signal power $<P_f(n)>_{B-1}$ when the one previous receiving burst signal (B−1) is received, the DSP 26 determines the average signal power $<P_f(n)>_B$ by way of Formula (23) below. In Formula (23), λ is a forgetting factor between 0 and 1 ($0 \leq \lambda \leq 1$).

$$\langle P_f(n)\rangle_B = P_f(n) + \lambda \langle P_f(n)\rangle_{B-1} \quad (23)$$

Thereafter, the DSP 26 determines the window signal powers $E_f(n)$ based on average signal powers $<P_f(n)>_B$ thus determined (step Y4), and then detects the maximum value $E_f(n_{max})$ window signal power (step Y5), and estimates the phase difference $\theta_{EP2}(mLN_F)$ corresponding to the frequency offset candidate $n\Delta f_{RES}$ corresponding to the maximum value $E_f(n_{max})$ as the second frequency offset (step Y6).

As described above, according to this Embodiment 4, the average processing is executed while the previous signal powers $P_f(n)$ are gradually forgotten by using the forgetting factor λ. Therefore, even in the case where the fading condition changes with the times, the average processing of the signal powers can be executed while following the time variation. Accordingly signal powers in conformity with the conditions of the transmission channel can be obtained. Therefore, even under an environment where C/N is low and the frequency offset changes with the times, the frequency offset can be estimated with high accuracy.

Embodiment 5

Figure 14:
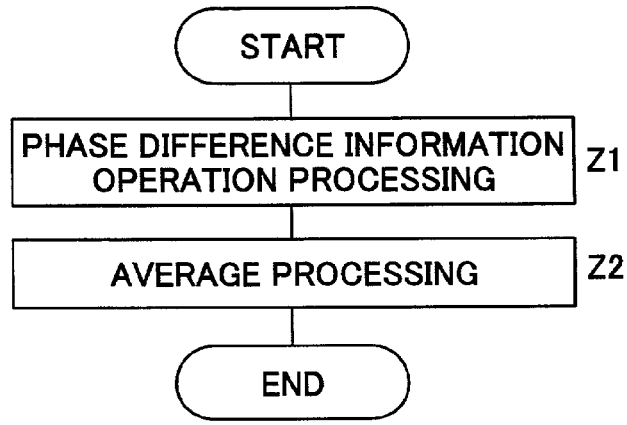
FIG. 14 is a flowchart for explanation of the first frequency offset estimation processing relating to Embodiment of the invention.

FIG. 14 is a flowchart for explanation of the first frequency offset estimation processing relating to Embodiment 5 of the invention.

In the abovementioned Embodiment 1, based on the distortion amounts $c_{EPi}(kN_F+i)$ of the transmission channel, the phase difference vector $D_{EP}(kN_F)$ between the adjacent known signals is determined. On the other hand, in this Embodiment 5 by determining only phase difference information that is the scalar quantity between the adjacent known signals based on the distortion amounts $c_{EPi}(kN_F+i)$ of the transmission channel, the processing is simplified.

Concretely, the DSP 26 executes phase difference information operation processing first between the known signals (step Z1). In this phase difference information operation processing, phase difference information as the scalar quantity between adjacent known signals is determined. That is, as shown by Formula (24) below, the DSP 26 converts the distortion amounts $c_{EPi}(kN_F+i)$ of the transmission channel into phase information $\theta_{EPi}(kN_F+i)$, and determines phase difference information $\Delta\theta_{EP}(kN_F)$ between adjacent known signals. In Formula (24) below, i shows the identification numbers which correspond one to one known signals, and is a value between 0 and $(N_P-2)$ ($0 \leq i \leq N_P-2$).

$$\Delta\theta_{EP}(kN_F) = \frac{1}{N_P-1} \sum_{i=0}^{N_P-2} (\theta_{EPi}(kN_F+i+1) - \theta_{EPi}(kN_F+i)) \quad (24)$$

$$\theta_{EPi}(kN_F+i) = \tan^{-1}\frac{\text{Im}[c_{EPi}(kN_F+i)]}{\text{Re}[c_{EPi}(kN_F+i)]}$$

Thereafter, the DSP 26 executes average processing for averaging the phase difference information $\Delta\theta_{EP}(kN_F)$ in one burst (step Z2). Concretely, the DSP 26 collects phase difference information $\Delta\theta_{EP}(kN_F)$ for the estimation period T from the estimation time (m−1)T to the estimation time mT. If the number of known signal blocks in the estimation period T is L, the DSP 26 obtains L of phase difference information $\Delta\theta_{EP}((m-1)LN_F+lN_F)$. Herein, l shows the indication numbers which correspond one to one known signal blocks, and is a value between 0 and (L−1) ($0 \leq l \leq L-1$).

Thereafter, as shown by Formula (25) below, the DSP 26 applies average processing to the collected L of phase difference information $\Delta\theta_{EP}((m-1)LN_F+lN_F)$, whereby the average phase difference $\theta_{EP1}(mLN_F)$ is determined as the first frequency offset.

$$\theta_{EPI}(mLN_F) = \frac{1}{L}\sum_{l=0}^{L-1} \Delta\theta_{EP}((m-1)LN_F + lN_F) \quad (25)$$

As described above, according to this Embodiment 5, the average processing is executed by using only the phase difference information. Therefore, the processing can be simplified.

Embodiment 6

Figure 15:
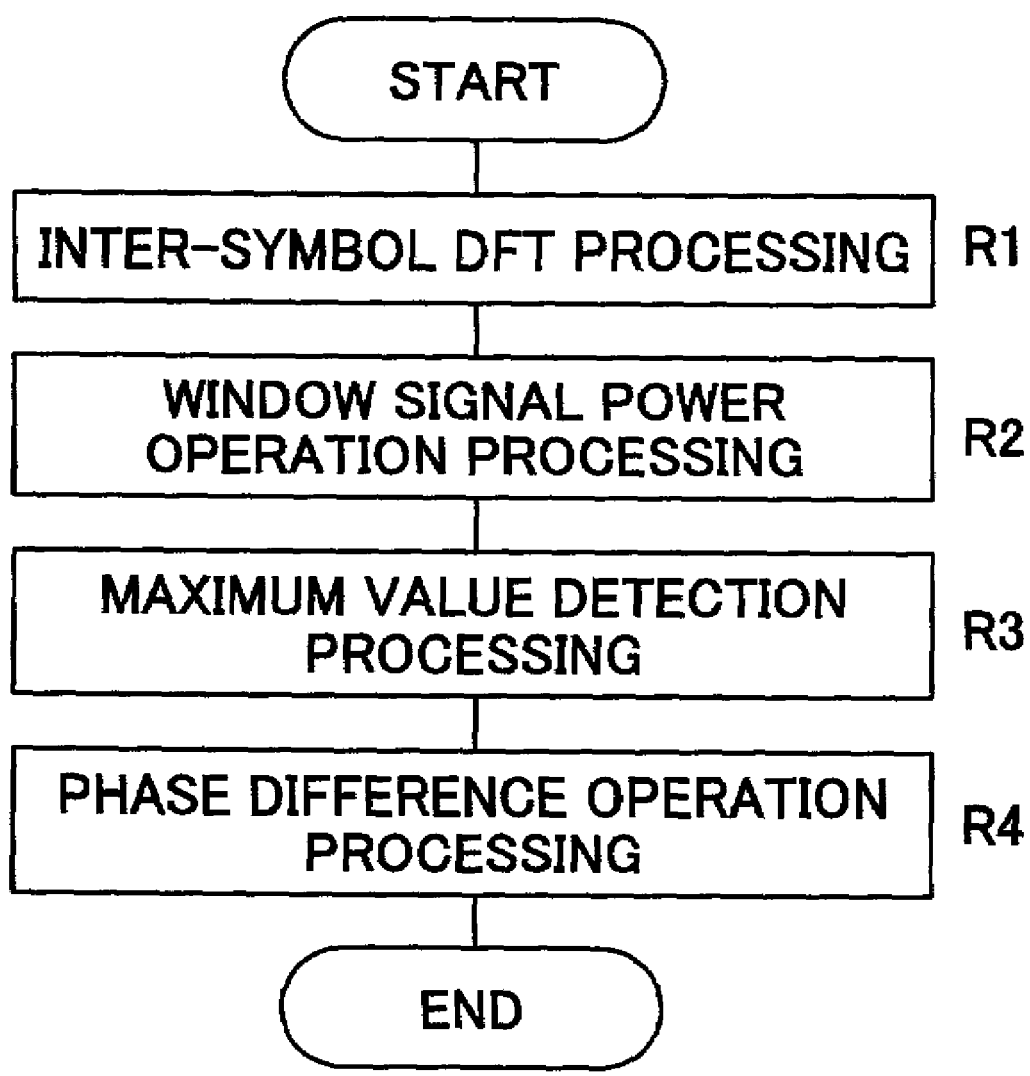
FIG. 15 is a flowchart for explanation of the first frequency offset estimation processing relating to Embodiment 6 of the invention.

FIG. 15 is a flowchart for explanation of the first frequency offset estimation processing relating to Embodiment 6 of the invention.

In the abovementioned Embodiment 1, the distortion amounts $c_{EPi}(kN_F+i)$ of the transmission channel are multiplied by the complex conjugate and summed, whereby the phase difference vector $D_{EP}(kN_F)$ between adjacent known signals is determined. On the other hand, in Embodiment 6, by applying DFT processing to the distortion amounts $c_{EPi}(kN_F+i)$ of the transmission channel, the phase difference vector $D_{EP}(kN_F)$ is determined.

Concretely, the DSP 26 executes inter-symbol DFT processing (step R1). More concretely, by applying the DFT processing to the distortion amounts $c_{EPi}(kN_F+i)$ of the transmission channel, the DSP 26 determines signal electric powers $P_{f1}(n)$ corresponding to the plurality of frequency offset candidates $n\Delta f_{RES}$. Still more concretely, as shown by Formula (26), within the frequency offset estimating range $f_{DET1}$ between $-R_S/2$ and $R_S/2$, the DSP 26 rotates the phases of the distortion amounts $c_{EPi}((m-1)LN_F+lN_F+i)$ of the transmission channel by the phase amounts corresponding to the respective frequency offset candidates $n\Delta f_{RES}$. Thereafter, the DSP 26 vector-synthesizes the distortion amounts $c_{EPi}((m-1)LN_F+lN_F+i)$ whose phases have been rotated, and determines signal powers $P_{f1}(n)$ corresponding to the plurality of frequency offset candidates $n\Delta f_{RES}$ within the frequency offset estimating range. In addition, in Formula (26) below, n is approximately a value between $-R_S/(2\Delta f_{RES})$ and $R_S/(2\Delta f_{RES})$.

are compensated based on the phase difference $\theta_{EP1}(mLN_F)$ as the first frequency offset, and the phase difference $\theta_{EP2}(mLN_F)$ as the second frequency offset based on the distortion amounts $c_{EPi}(kN_F+i)$ after being compensated is estimated.

Herein, the first frequency offset corresponds to the frequency $f_D$ of the direct wave, and the frequency $f_D$ of the direct wave exists near the center frequency $f_M$ of the Doppler spread (see FIG. 9A). Therefore, on supposition that a certain range around the frequency $f_D$ of the direct wave is a frequency offset estimating range, it can be expected that the center frequency $f_M$ of the Doppler spread exists within the range.

Therefore, in Embodiment 7, the frequency offset estimating range for estimation of the second frequency offset based on the first frequency offset is regulated.

Concretely, the DSP 26 detects the distortion amounts $c_{EPi}(kN_F+i)$ of the transmission channel (step Q1), and then $$P_{fl}(n) = \sum_{l=0}^{L-1} \left| \sum_{i=0}^{N_P-2} c_{EPi}((m-1)LN_F + 1N_F + i)\exp\left(-j\frac{2\pi n(1N_F + i)\Delta f_{RES}}{R_S}\right) \right|^2 \quad (26)$$

Then, the DSP 26 vector-synthesizes the distortion amounts $c_{EPi}((m-1)LN_F+lN_F+i)$ whose phases have been rotated, and obtains signal powers $P_{f1}(n)$ corresponding to the respective plurality of frequency offset candidates $n\Delta f_{RES}$.

Then, the DSP 26 executes window signal power operation processing (step R2). Concretely, as shown by Formula (27), the DSP 26 sums the signal powers $P_{f1}(n)$ corresponding to the frequency offset candidates $n\Delta f_{RES}$ in the window having a frequency width of $2W_1\Delta f_{RES}$, whereby the window signal powers $E_{f1}(n)$ are determined.

$$E_{fl}(n) = \sum_{k=-W_1}^{W_1} P_{fl}(n+k) \quad (27)$$

Thereafter, the DSP 26 executes maximum value detection processing to detect the maximum value $E_{f1}(n_{MAX})$ among the window signal powers $E_{f1}(n)$ (step R3), and executes phase difference operation processing based on the detected maximum value $E_{f1}(n_{Max})$ (step R4), whereby the phase difference $\theta_{EP1}(mLN_F)$ is estimated as the first frequency offset.

As described above, according to Embodiment 6, frequency offset candidates $n\Delta f_{RES}$ are set for each estimation accuracy $\Delta f_{RES}$ signal powers $P_{f1}(n)$ corresponding to the respective frequency offset candidates $n\Delta f_{RES}$ are determined, and the signal powers $P_{f1}(n)$ are smoothed by using the frequency window, whereby the first frequency offset is estimated. Therefore, for example, if the estimation accuracies $\Delta f_{RES}$ are finely set, the estimation accuracy of the first frequency offset can be improved.

Embodiment 7

Figure 16:
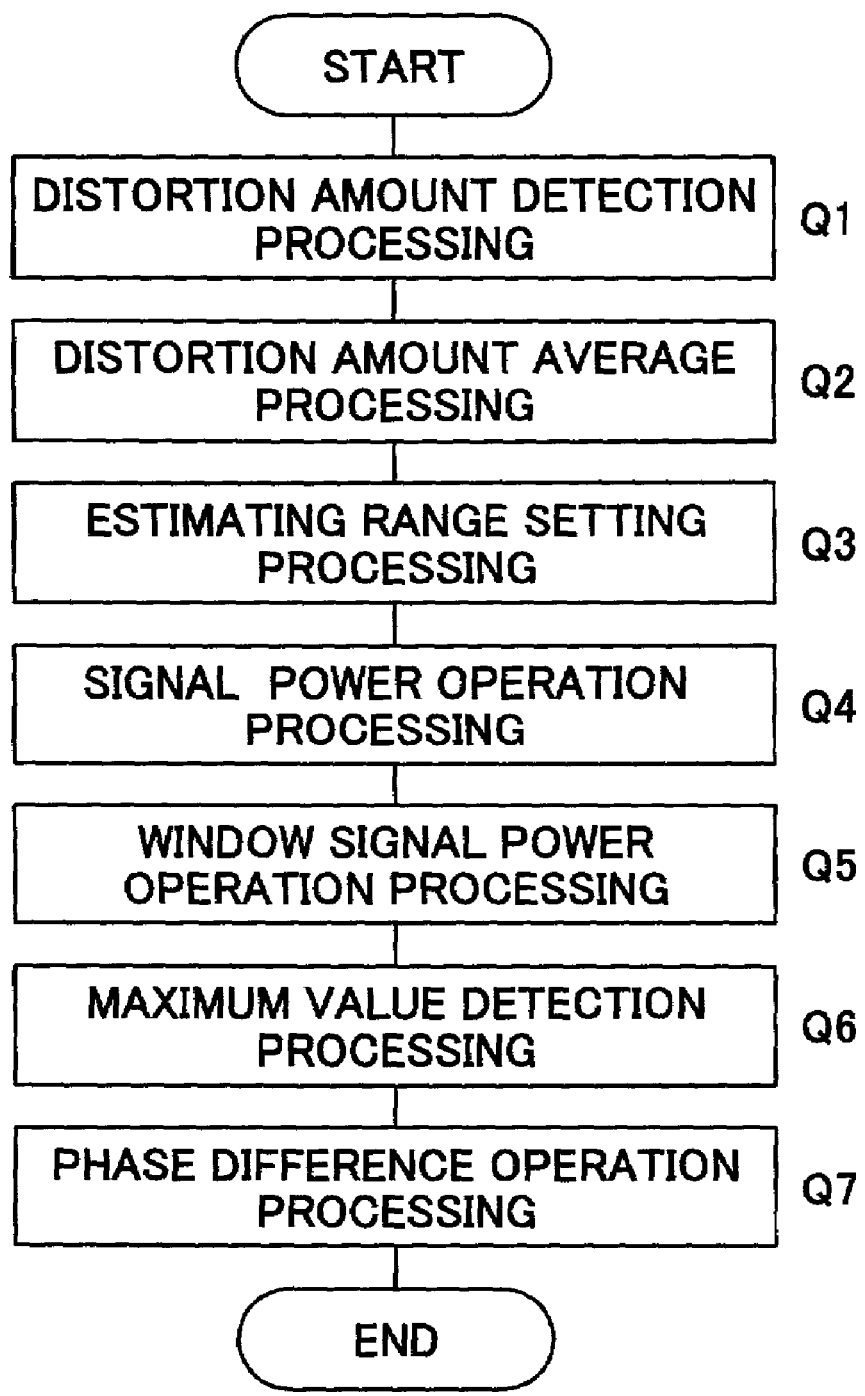
FIG. 16 is a flowchart for explanation of frequency offset estimation processing relating to Embodiment 7 of the invention.

FIG. 16 is a flowchart for explanation of the frequency offset estimation processing relating to Embodiment 7 of the invention.

In the abovementioned Embodiments 1 through 6, the distortion amounts $c_{EPi}(kN_F+i)$ of the transmission channel executes the first frequency offset estimation processing and the second frequency offset estimation processing simultaneously. More concretely, the DSP 26 estimates the first frequency offset based on the abovementioned distortion amounts $c_{EPi}(kN_F+i)$ of the transmission channel. The DSP 26 temporarily holds, for example, this first frequency offset.

In addition, the DSP 26 executes the first frequency offset estimation processing and distortion amount average processing simultaneously (step Q2). Concretely, the DSP 26 applies average processing to the distortion amounts $c_{EPi}(kN_F+i)$ of the transmission channel to determine the average distortion amount $c_{EP}(kN_F)$. Thereafter, the DSP 26 executes DFT processing (steps Q3 and Q4). Concretely, the DSP 26 applies DFT processing to L of average distortion amounts $c_{EP}((m+1)N_F)$ in the estimation period T (=$LN_FT_S$), and determines signal powers $P_f(n)$ corresponding to the plurality of frequency offset candidates $n\Delta f_{RES}$ respectively.

More concretely, the DSP 26 sets a frequency offset estimating range based on the first frequency offset (step Q3), and determines signal powers $P_f(n)$ corresponding to the plurality of possible frequency offsets $n\Delta f_{RES}$ within the frequency offset estimating range respectively (step Q4).

Still more concretely, the DSP 26 accords the first frequency offset to any one of the frequency offset candidates $n\Delta f_{RES}$ set in advance for each estimation accuracy $\Delta f_{RES}$. Herein, the frequency offset candidate in accordance with the first frequency offset is shown by $N\Delta f_{RES}$. In addition, the DSP 26 sets the range around this frequency offset candidate $N\Delta f_{RES}$, that is, the range between $(-M+N)\Delta f_{RES}$ and $(M+N)\Delta f_{RES}$ as the frequency offset estimation range. M is the constant shown in Formula Thereafter, as shown by Formula (28) below, based on the phase amounts corresponding to the respective frequency offset candidates $\Delta f_{RES}$ within this set frequency offset estimation range, the DSP 26 rotates the phases of the average distortion amounts $c_{EP}((m+1)N_F)$ ($0 \leq l \leq L-1$). In Formula (28) below, n is a value between $(-M-W+N)$ and $(M+W+N)$.

$$P_f(n) = \left| \sum_{l=0}^{L-1} c_{EP}((m+1)N_F) \exp\left( -j \frac{2\pi l N_F n \Delta f_{RES}}{R_S} \right) \right|^2 \quad (28)$$

The DSP 26 vector-synthesizes the average distortion amounts $c_{EP}((m+1)N_F)$ whose phases have been rotated. Thereby, the DSP 26 determines signal powers $P_f(n)$ corresponding to the plurality of frequency offset candidates $n\Delta f_{RES}$ respectively.

Thereafter, the DSP 26 determines window signal power $E_f(n)$ by cyclically summing the signal powers $P_f(n)$ in a frequency window with a predetermined frequency width (step Q5). The DSP 26 determines the maximum value $E_f(n_{MAX})$ of the window signal power (step Q6), and estimates the frequency offset candidate $n\Delta f_{RES}$ of this maximum value $E_f(n_{MAX})$ as the last frequency offset (step Q7).

As described above, according to Embodiment 7, the frequency offset estimating range to estimate the frequency offset based on the first frequency offset is set. Therefore, the first frequency offset elimination processing and phase synthesis processing become unnecessary. Therefore, the processing can be simplified.

In addition, since the first frequency offset is estimated in a relatively wide frequency offset estimating range, a sufficient frequency offset compensating range is secured. Also, since the center frequency of the Doppler spread is used to estimate the last frequency offset, excellent BER characteristics are secured. Therefore, the same effects as in Embodiment 1 such as securing of a sufficient frequency offset compensating range and prevention of deterioration in the BER characteristics can also be obtained.

Embodiment 8

FIG. 17 is a flowchart for explanation of demodulation processing relating to Embodiment 8 of the invention.

In Embodiment 1, the frequency offset elimination processing in which the phase of the digital baseband signal is rotated is executed after filtering processing. On the other hand, in this Embodiment 8, the frequency offset elimination processing is executed previous to the filtering processing.

Frequency offset of the receiving burst signal occurs due to the stability of the oscillation circuit of the transmitter 1 and receiver 10 as explained in the subsection "Discription of the Related Art" above. Particularly, in the case where low-cost oscillation circuits are used, since the frequency stability is low, great frequency offset occurs. In addition, the frequency stability of the oscillation circuits is influenced by the surrounding environment such as temperature and changes in the power supply voltage.

Therefore, there is every possibility that the frequency offset becomes greater in accordance with time elapse although the offset is slight at the beginning. In this case, the frequency bandwidth of the receiving burst signal may expand to a large frequency bandwidth in comparison with the cutoff frequency in the filtering processing. Therefore, a part of the receiving burst signal may be cut by the filtering processing. Accordingly, the data decision may not be sufficiently carried out.

In view of the above circumstances, in this Embodiment 8, the frequency offset elimination processing is executed prior to the filtering processing. Concretely, in this Embodiment 8, the frequency offset elimination processing is executed prior to the filtering processing, and distortion amount detection processing, frequency offset estimation processing, and integration processing are executed simultaneously with sequential processing including fading distortion compensation processing and data decision processing.

Figure 17B:
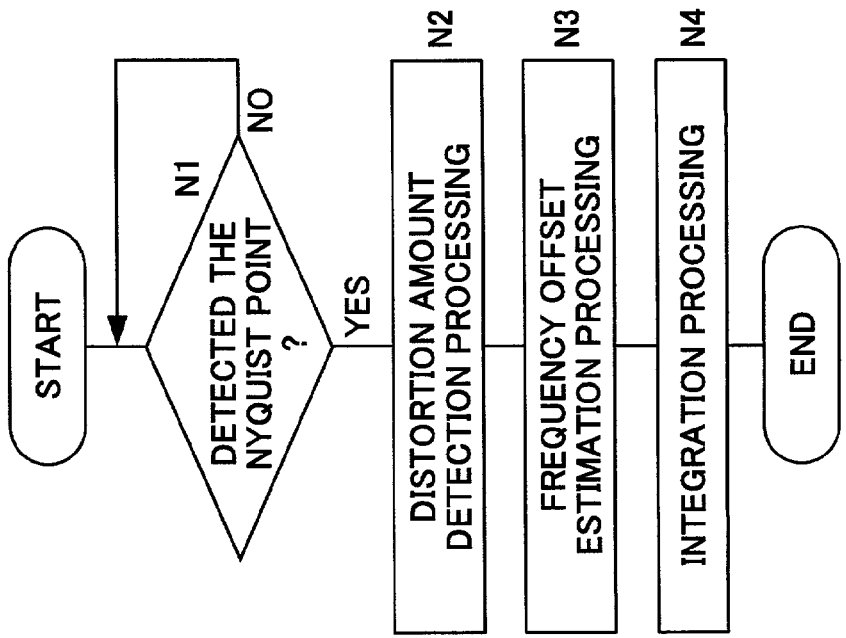
FIG. 17 is a flowchart for explanation of demodulation processing relating to Embodiment 8 of the invention.
Figure 17A:
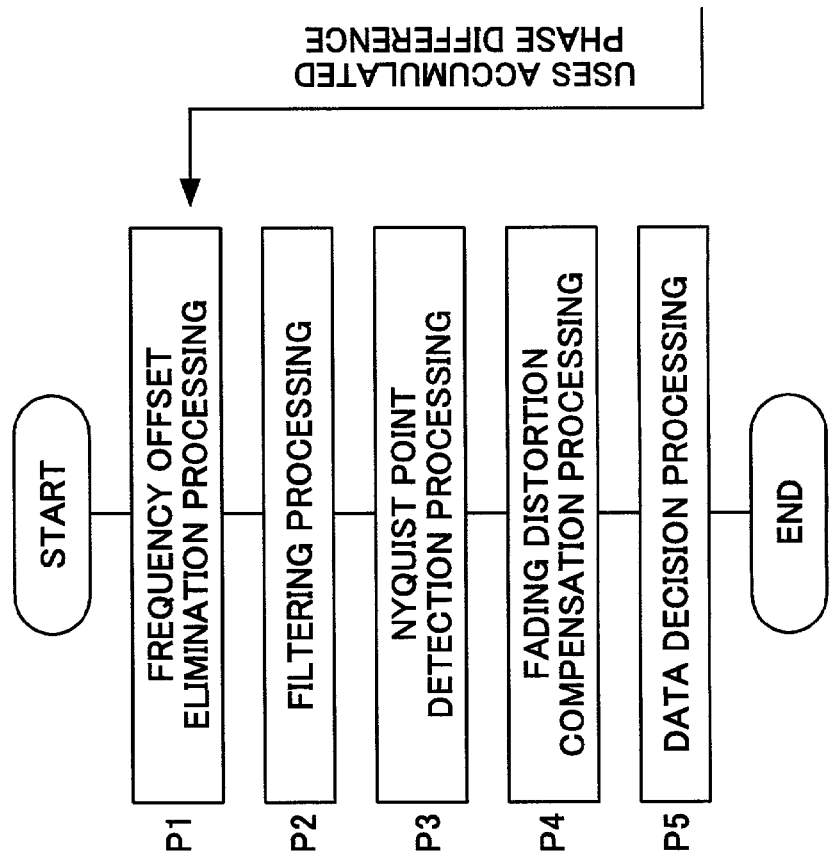

More concretely, as shown in FIG. 17A, when digital baseband signals are supplied from the A/D converter circuits 25a and 25b, previous to the filtering processing, the DSP 26 executes frequency offset elimination processing (step P1). Still more concretely, based on the accumulated phase difference $\theta((m-1)LN_F+lN_F+i)$ determined by the separately executed integration processing, the phases of the digital baseband signals are rotated in reverse. Thereby, digital baseband signals from which frequency offset has been eliminated are obtained.

Thereafter, the DSP 26 applies filtering processing to the digital baseband signals (step P2) to eliminate noise components and the like. Thereafter, the DSP 26 detects a digital baseband signal corresponding to the Nyquist point (step S3), eliminates fading distortion from the digital baseband signal (step P4), and then executes data decision processing (step P5).

On the other hand, as shown in FIG. 17B, the DSP 26 decides whether or not the digital baseband signal corresponding to the Nyquist point has been detected (step N1). If the Nyquist point has been detected, based on the digital baseband signal corresponding to the Nyquist point, the DSP 26 detects the distortion amount $c_{EPt}(kN_F+i)$ of the transmission channel (step N2). Thereafter, based on the distortion amount $c_{EPt}(kN_F+i)$ of the transmission channel, the DSP 26 estimates the phase difference $\theta_S(mLN_F)$ corresponding to the frequency offset (step N3), and cyclically sums the phase differences $\theta_S((mLN_F)$, whereby an accumulated phase difference $((m-1)LN_F+lN_F+i)$ is determined (step N4). The DSP 26 uses this determined accumulated phase difference $\theta((m-1)LN_F+lN_F+i)$ for the frequency offset elimination processing in step P1.

As described above, according to this Embodiment 8, the frequency offset elimination processing is executed before the filtering processing. Therefore, even if the frequency bandwidths of the receiving burst signals are greater than the cutoff frequency in the filtering processing, the frequency offset can be eliminated while a part of the receiving burst signals is not cut. Therefore, data decision can be satisfactorily carried out.

Embodiment 9

FIG. 18 is a flowchart for explanation of demodulation processing relating to Embodiment 9 of the invention.

In the abovementioned Embodiments 1 through 8, by directly rotating the phase of the digital baseband signal, the frequency offset is compensated. On the other hand, in this Embodiment 9, the phase of the receiving burst signal is rotated by changing the frequency of the local oscillation signal generated at the oscillation circuit 22, whereby the frequency offset is compensated.

Concretely, in this Embodiment 9, digital signal processing by way of software is not applied to the digital baseband signal, but a voltage to be applied to the oscillation circuit 22 comprised of VCO is controlled to eliminate the frequency offset.

Figure 18B:
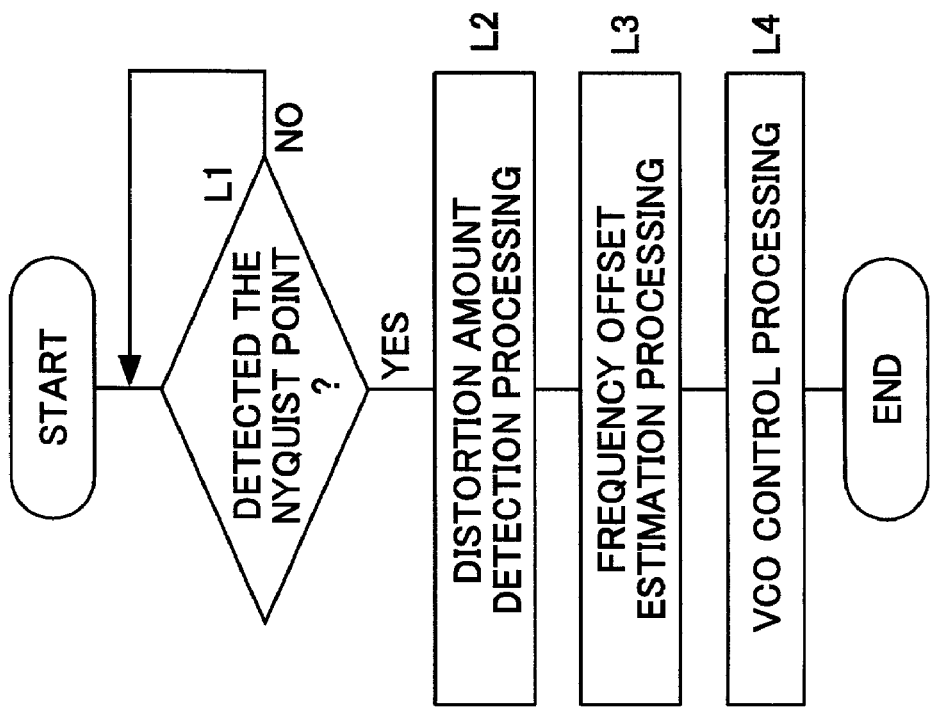
FIG. 18 is a flowchart for explanation of demodulation processing relating to Embodiment 9 of the invention.
Figure 18A:
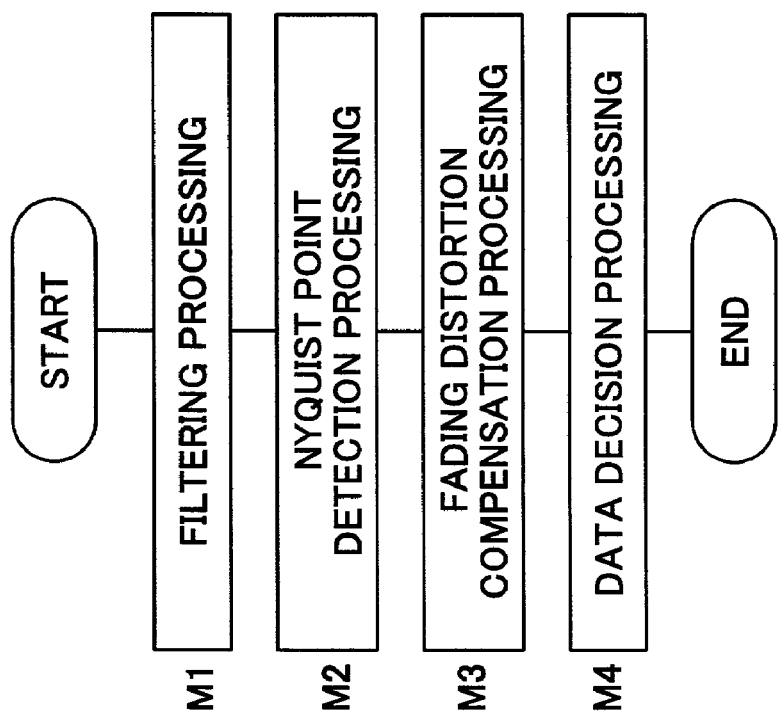

That is, in this Embodiment 9, as shown in FIG. 18A, filtering processing (step M1), Nyquist point detection processing (step M2), fading distortion compensation processing (step M3), and data decision processing (step M4) are executed, and simultaneously with these sequential processings, as shown in FIG. 18B, distortion amount detection processing, frequency offset estimation processing, and VCO control processing for controlling the voltage to be applied to the VCO 22 are executed.

More concretely, the DSP 26 decides whether or not the digital baseband signal corresponding to the Nyquist point has been detected (step L1). In the case where the Nyquist point has been detected, the DSP 26 detects the distortion amount $c_{EPi}(kN_F+i)$ of the transmission channel based on the digital baseband signal corresponding to the Nyquist point (step L2). Thereafter, the DSP 26 estimates frequency offset based on the distortion amount $c_{EPi}(kN_F+i)$ of the transmission channel (step L3). Then, the DSP 26 supplies a voltage in accordance with the estimated frequency offset to the VCO 22 (step L4).

Thereby, the VCO 22 oscillates a local oscillation signal having an oscillation frequency which has deviated by an amount according to the frequency offset from the original oscillation frequency. Therefore, the frequency converter circuit 21 outputs an analog baseband signal from which frequency offset has been eliminated. Thus, excellent frequency offset compensation can be realized.

As described above, according to Embodiment 9, by adjusting the frequency of the local oscillation signal generated by the VCO 22, the frequency offset is eliminated from the receiving IF signal. That is, before the filtering processing by the DSP 26, the frequency offset is eliminated. Therefore, as in the abovementioned Embodiment 8, even if the frequency bandwidth of the receiving burst signal expands to be larger than the cutoff frequency in the filtering processing, frequency offset can be eliminated while a part of the receiving burst signal is not cut. Therefore, the data decision can be satisfactorily carried out.

Embodiment 10

Figure 19:
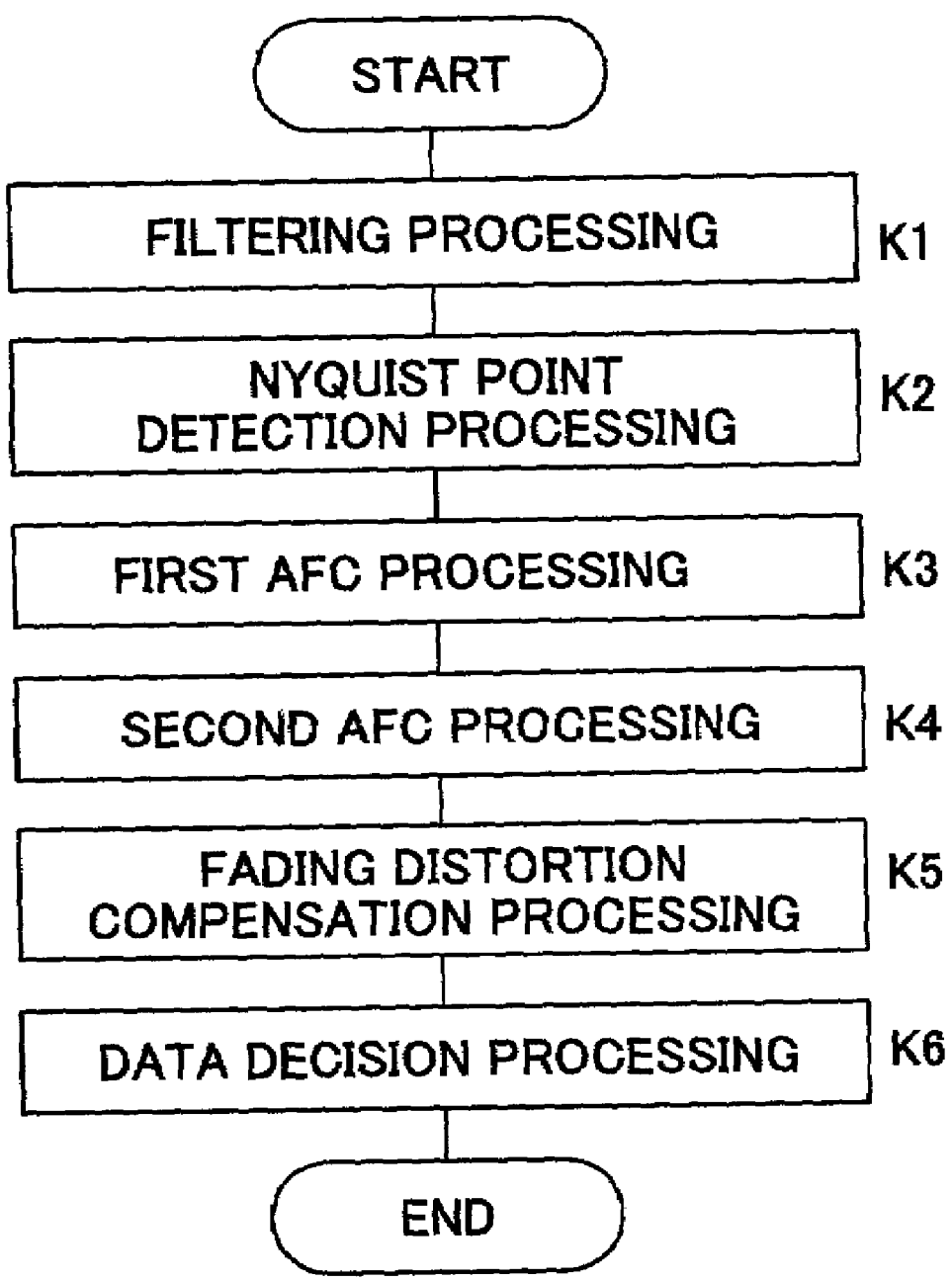
FIG. 19 is a flowchart for explanation of demodulation processing relating to Embodiment 10 of the invention.

FIG. 19 is a flowchart for explanation of demodulation processing relating to Embodiment 10 of the invention.

In the abovementioned Embodiment 1, the first frequency offset and the second frequency offset are synthesized to estimate the last frequency offset, and in accordance with this frequency offset, compensation for the frequency offset is carried out, whereby the frequency of the digital baseband signal is automatically controlled. On the other hand, in this Embodiment 10, frequency offset compensation in accordance with the first frequency offset is carried out for the digital baseband signals, and frequency offset compensation in accordance with the second frequency offset is carried out for digital baseband signals after the abovementioned compensation is carried out, whereby the frequency of the digital baseband signal is automatically controlled.

Concretely, the DSP 26 applies predetermined filtering processing to the digital baseband signals (step K1), and then detects a digital baseband signal corresponding to Nyquist point (step K2). Next, the DSP 26 executes the first automatic frequency control processing (hereinafter, referred to as the first AFC processing) for the digital baseband signal (step K3), and then executes the second automatic frequency control processing (hereinafter, referred to as the second AFC processing) for the digital baseband signal after being subjected to the first AFC processing (step K4). Then, the DSP 26 executes fading distortion compensation processing for the digital baseband signal after being subjected to the second AFC processing (step K5), and applies data decision processing to the signal (step K6), whereby data corresponding to the original information signal is restored.

Figure 20:
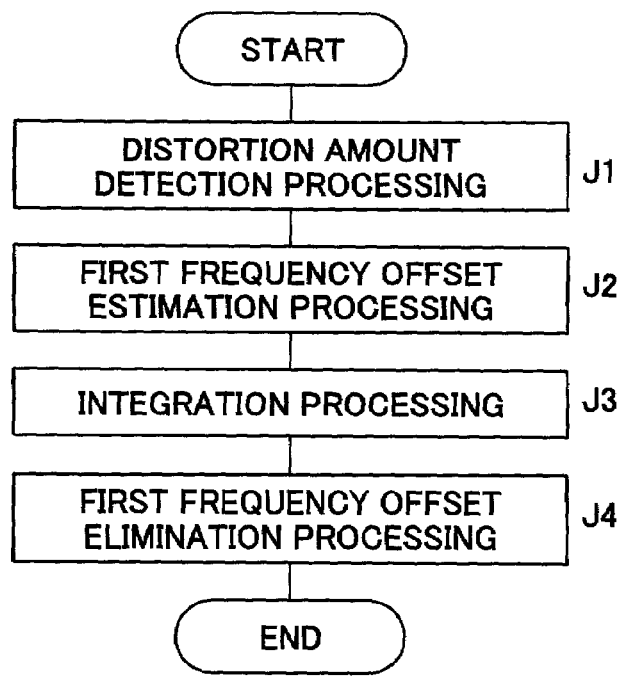
FIG. 20 is a flowchart for explanation of the first AFC processing.

FIG. 20 is a flowchart for explanation of the first AFC processing. The DSP 26 detects the distortion amounts $c_{EPi}(kN_F+i)$ of the transmission channel for each symbol (step J1), and then executes the first frequency offset estimation processing (step J2). The first frequency offset estimation processing is the same as that in the abovementioned Embodiment 1, and by this processing, the DSP 26 estimates the phase difference $\theta_{EP1}(mLN_F)$ as the first frequency offset corresponding to the phase rotation amount for one symbol.

Thereafter, the DSP 26 executes integration processing for cyclically summing the phase differences $\theta_{EP1}(mLN_F)$ (step J3) to obtain an accumulated phase difference $\theta_1((m-1)LN_F+lN_F+i)$. In this case, the DSP 26 obtains the phase difference $\theta_1((m-1)LN_F+lN_F+i)$ accumulated from the estimation time mT for each symbol period $T_S$.

Thereafter, the DSP 26 executes the first frequency offset elimination processing (step J4). Concretely, based on the accumulated phase difference $\theta_1((m-1)LN_F+lN_F+i)$, the DSP 26 rotates in reverse the phase of the digital baseband signal $r(kN_F+i)$ by an amount in accordance with the accumulated phase difference $\theta_1((m-1)LN_F+lN_F+i)$. Thereby, the first frequency offset can be eliminated from the digital baseband signal $r(kN_F+i)$. Thus, the DSP 26 achieves automatic frequency control of the digital baseband signals $r(kN_F+i)$ based on the first frequency offset.

Figure 21:
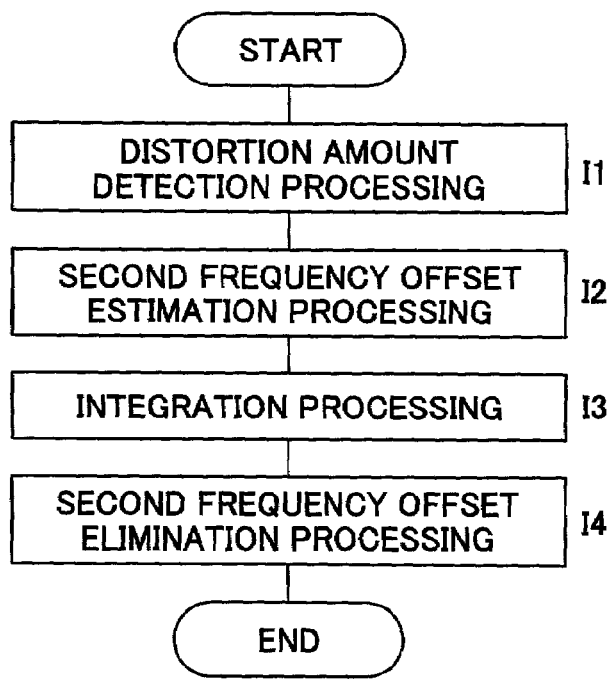
FIG. 21 is a flowchart for explanation of the second AFC processing.

FIG. 21 is a flowchart for explanation of the second AFC processing. Based on the known signal blocks of the digital baseband signal after being subjected to the first AFC processing, the DSP 26 detects the distortion amount $c_{EPi2}(kN_F+i)$ of the transmission channel for each symbol in the known signal blocks (step I1).

Thereafter, based on the detected distortion amount $c_{EPi2}(kN_F+i)$ of the transmission channel, the DSP 26 executes the second frequency offset estimation processing that is the same as in Embodiment 1 (step I2). Thereby, the DSP 26 estimates the phase difference $\theta_{EP2}(mLN_F)$ as the second frequency offset corresponding to the phase rotation amount for one symbol.

Thereafter, the DSP 26 executes integration processing for cyclically summing the phase differences $\theta_{EP2}(mLN_F)$ (step I3), and obtains an accumulated phase difference $\theta_2((m-1)LN_F+lN_F+i)$. In this case, the DSP 26 obtains the phase difference $\theta_2((m-1)LN_F+lN_F+i)$ accumulated from the estimation time mT for each symbol period $T_S$.

Thereafter, the DSP 26 executes the second frequency offset elimination processing (step I4). Concretely, based on the accumulated phase difference $\theta_2((m-1)LN_F+lN_F+i)$, the DSP 26 rotates in reverse the phase of the digital baseband signal $r_{R1}(kN_F+i)$ by an amount according to the accumulated phase difference $\theta_2((m-1)LN_F+lN_F+i)$. Thereby, the second frequency offset can be eliminated from the digital baseband signal $r_{R1}(kN_F+i)$. Thus, the DSP 26 achieves automatic frequency control of the digital baseband signal $r_{R1}(kN_F+i)$ based on the second frequency offset.

As described above, according to this Embodiment 10, compatibility of securing of a sufficient frequency offset compensating range and securing of excellent BER characteristics is also achieved.

Embodiment 11

FIG. 22 is a flowchart for explanation of demodulation processing relating to Embodiment 11 of the invention.

In the above mentioned Embodiment 10, the frequency offset elimination processing is executed after the filtering processing. On the other hand, in this Embodiment 11, the frequency offset elimination processing is executed before the filtering processing.

Concretely, in this Embodiment 11, the first frequency offset elimination processing that is a part of the first AFC processing is executed before the filtering processing, and the remaining processing of the first AFC processing, that is, distortion amount detection processing, the first frequency offset estimation processing, and integration processing are executed simultaneously with sequential processing.

More concretely, as shown in FIG. 22A, when the digital baseband signals are supplied from the A/D converter circuits 25a and 25b, and previous to the filtering processing, the DSP 26 executes the first frequency offset elimination processing (step H1). Still more concretely, the DSP 26 rotates in reverse the phases of the digital baseband signals by amounts according to the accumulated phase difference $\theta((m-1)LN_F+lN_F+i)$ corresponding to the first frequency offset determined by the integration processing executed simultaneously with the sequential processing. Thereby, digital baseband signals from which first frequency offset has been eliminated are obtained.

Thereafter, the DSP 26 applies filtering processing to the digital baseband signals (step H2) to eliminate noise components and the like, and then detects a digital baseband signal corresponding to the Nyquist point (step H3). Thereafter, the DSP 26 executes the second AFC processing based on the digital baseband signal (step H4). By executing this second AFC processing, the DSP 26 can obtain a digital baseband signal in which the last frequency offset has been eliminated. Next, the DSP 26 eliminates fading distortion from the digital baseband signal (step H5), and then executes data decision processing (step H6).

On the other hand, as shown in FIG. 22B, the DSP 26 decides whether or not the digital baseband signal corresponding to the Nyquist point has been detected (step G1). In the case where the Nyquist point has been detected, based on the digital baseband signal corresponding to the Nyquist point, the DSP 26 detects the distortion amount $c_{EPi}(kN_F+i)$ of the transmission path (step G2). Thereafter, based on the distortion amount $c_{EPi}(kN_F+i)$ of the transmission channel, the DSP 26 estimates the phase difference $\theta_S(mLN_F)$ corresponding to the first frequency offset (step G3), and cyclically sums the phase differences $\theta_S(mLN_F)$, whereby an accumulated phase difference $\theta((m-1)LN_F+lN_F+i)$ is determined (step G4). The DSP 26 uses this determined accumulated phase difference $\theta((m-1)LN_F+lN_F+i)$ for the first frequency offset elimination processing in step H1.

As described above, according to this Embodiment 11, the first frequency offset elimination processing is executed before the filtering processing. Therefore, even when the frequency bandwidth of the receiving IF signal becomes larger than the cutoff frequency in the filtering processing, the first frequency offset can be eliminated while a part of the receiving IF signals is not cut. Therefore, data decision can be satisfactorily carried out.

Embodiment 12

FIG. 23 is a flowchart for explanation of demodulation processing relating to Embodiment 12 of the invention.

In the abovementioned Embodiment 10, by directly rotating the phase of the digital baseband signal, the frequency offset is compensated. On the other hand, in this Embodiment 12, by adjusting the frequency of the local oscillation signal generated by the oscillation circuit 22 that is the VCO, the phase of the receiving burst signal is rotated, whereby the frequency offset is compensated.

Concretely, in this Embodiment 12, digital signal processing by way of software is not applied to the digital baseband signal, but the voltage to be applied to the oscillation circuit 22 formed of the VCO is controlled, whereby the frequency offset is eliminated.

Figure 23B:
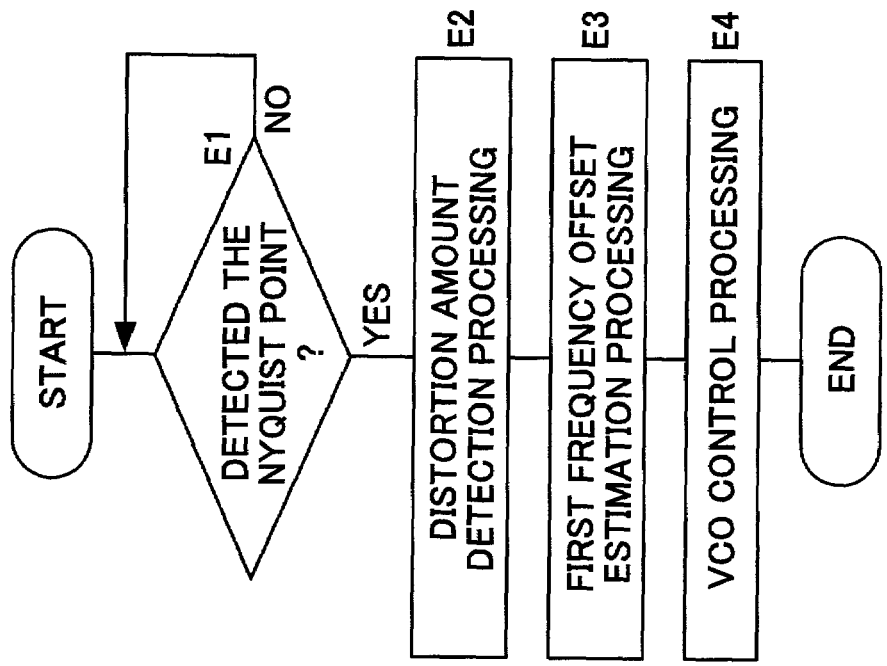
FIG. 23 is a flowchart for explanation of demodulation processing relating to Embodiment 12 of the invention.
Figure 23A:
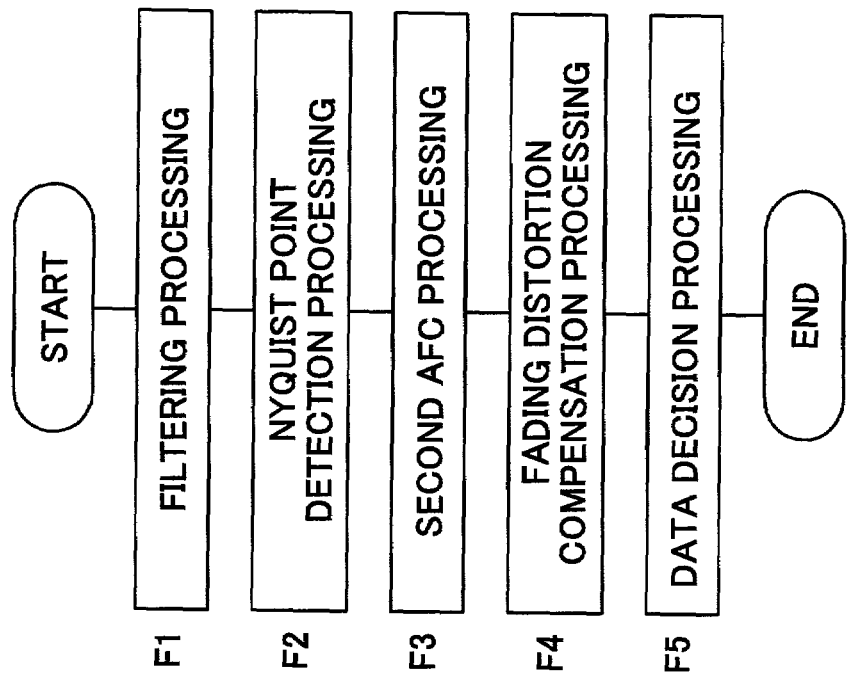

That is, in this Embodiment 12, as shown in FIG. 23A, the filtering processing (step F1), Nyquist point detection processing (step F2), the second AFC processing (step F3), fading distortion compensation processing (step F4), and data decision processing (step F5) are executed, and simultaneously with these sequential processings, as shown in FIG. 23B, distortion amount detection processing, the first frequency offset estimation processing, and VCO control processing for controlling the voltage to be applied to the VCO 22 are executed.

Concretely, the DSP 26 decides whether or not the digital baseband signal corresponding to the Nyquist point has been detected (step E1). In the case where the Nyquist point has been detected, based on the digital baseband signal corresponding to the Nyquist point, the DSP 26 detects the distortion amount $c_{EPi}(kN_F+i)$ of the transmission channel (step E2). Thereafter, the DSP 26 estimates the first frequency offset based on the distortion amount $c_{EPi}(kN_F+i)$ of the transmission channel (step E3). Then, the DSP 26 applies a voltage according to the estimated first frequency offset to the VCO 22 (step E4).

Thereby, the VCO 22 oscillates the local oscillation signal having an oscillation frequency deviated by an amount in accordance with the first frequency offset from the original oscillation frequency. Therefore, the frequency converter circuit 21 outputs analog baseband signals in which the first frequency offset has been eliminated. Thus, excellent frequency offset compensation can be realized.

As described above, according to this Embodiment 12, by adjusting the frequency of the local oscillation signal generated by the VCO 22, frequency offset is eliminated from the receiving IF signal. That is, the first frequency offset is eliminated before the filtering processing. Therefore, as in the abovementioned Embodiment 11, even when the frequency bandwidth of the receiving IF signal expands to be larger than the cutoff frequency in the filtering processing, frequency offset can be eliminated while a part of the receiving IF signal is not cut. Therefore, data decision can be satisfactorily carried out.

Other Embodiments

The Embodiments of the invention are as described above, however, the invention is not limited to the abovementioned Embodiments. For example, in the Embodiments, the case where the TDMA is applied as the communications method is described. However, as the communications method, the FDMA (Frequency Division Multiple Access), CDMA (Code Division Multiple Access), or the like may be applied. In such a case, the radio receiving signals are not burst signals but are continuous signals as in the case where TDMA is applied. However, needless to say, the invention can be easily applied even to this case.

In addition, in the abovementioned Embodiments, the case where the demodulation processing is realized by way of software by the DSP 26 is described. However, of course, the steps of the demodulation processing to be executed by the DSP 26 may be realized by hardware circuits.

What is claimed is:

1. An automatic frequency control method for controlling the frequency of a radio receiving signal by compensating a frequency offset of the radio receiving signal, said radio receiving signal periodically including a plurality of adjacent known signals, comprising:
   estimating a frequency of a direct wave of the radio receiving signal and a center frequency of a Doppler spread of the radio receiving signal based on distortion amounts of the adjacent known signals included in the radio receiving signal, and
   compensating the frequency offset of the radio receiving signal based on both of said frequency of a direct wave and said center frequency of a Doppler spread.

2. An automatic frequency control method according to claim 1, wherein the radio receiving signal is a burst signal synchronized with a predetermined time slot in the TDMA.

3. An automatic frequency control method for controlling the frequency of a radio receiving signal by eliminating frequency offset from the radio receiving signal, said radio receiving signal periodically including a plurality of adjacent known signals, comprising:
   a frequency offset estimating step of estimating a frequency offset of the radio receiving signal from a frequency of a direct wave of the radio receiving signal, which is estimated based on distortion amounts of the adjacent known signals included in the radio receiving signal, and a center frequency of the Doppler spread of the radio receiving signal; and
   a frequency offset eliminating step of eliminating the estimated frequency offset from the radio receiving signal.

4. An automatic frequency control method according to claim 3, wherein the frequency offset estimating step includes:
   a distortion amount operating step of determining the distortion amounts of the known signals included in the radio receiving signal;
   a first frequency offset estimating step of estimating the frequency of the direct wave of the radio receiving signal based on the distortion amounts between adjacent known signals among these determined distortion amounts;
   a distortion amount frequency offset eliminating step of eliminating frequency offset from the distortion amounts of the known signals based on the estimated frequency of the direct wave;
   a second frequency offset estimating step of estimating the center frequency of the Doppler spread of the radio receiving signal based on the distortion amounts between the periodically inserted known signals among the distortion amounts from which the frequency offset has been eliminated; and
   a synthesizing step of synthesizing the phase amount corresponding to the frequency of the direct wave and the phase amount corresponding to the center frequency of the Doppler broadening to estimate frequency offset of the radio receiving signal.

5. An automatic frequency control method according to claim 4, wherein the first frequency offset estimating step includes steps of:
   determining the phase difference vectors based on the distortion amounts between adjacent known signals among the determined distortion amounts;
   determining the average phase difference vector by averaging the determined phase difference vectors for a predetermined period; and
   estimating the frequency of the direct wave based on the determined average phase difference vector.

6. An automatic frequency control method according to claim 4, wherein the second frequency offset estimating step includes steps of:
   determining the average distortion amount by averaging the distortion amounts from which frequency offset has been eliminated;
   determining signal powers corresponding to a plurality of frequency offset candidates set at each predetermined interval within a predetermined frequency offset estimating range based on the determined average distortion amount;
   determining the window signal power of all frequency offset candidates within the frequency offset estimating range by summing the signal powers of the frequency offset candidates in the frequency window with a predetermined frequency width among the determined signal powers; and
   estimating the frequency offset candidate corresponding to the maximum value of the determined window signal power as the center frequency of the Doppler spread.

7. An automatic frequency control method according to claim 4, wherein the first frequency offset estimating step includes steps of:
   determining phase difference information based on the distortion amounts between the adjacent known signals among the distortion amounts;
   determining average phase difference information by averaging the determined phase difference information for a predetermined period; and
   estimating the frequency of the direct wave based on the determined average phase difference information.

8. An automatic frequency control method according to claim 4, wherein the first frequency offset estimating step includes steps of:
   determining signal powers corresponding to a plurality of frequency offset candidates set at each predetermined interval in a predetermined frequency offset estimating range based on the distortion amounts of the adjacent known signals among the distortion amounts;
   determining window signal powers corresponding to all frequency offset candidates by summing signal powers corresponding to the frequency offset candidates in a frequency windows with predetermined frequency widths among the determined signal powers; and
   estimating the frequency offset candidate corresponding to the maximum value of the determined window signal powers as the frequency of the direct wave.

9. An automatic frequency control method according to claim 3, wherein the frequency offset estimating step includes:
   a distortion amount operating step of determining distortion amounts of the known signals included in the radio receiving signal;
   a first frequency offset estimating step of estimating the frequency of the direct wave of the radio receiving signal based on the distortion amounts between the adjacent known signals among the determined distortion amounts;
   an average distortion amount operating step of determining the average distortion amount by averaging the determined distortion amounts;
   a signal power operating step of determining signal powers corresponding to a plurality of frequency offset candidates set at each predetermined interval in a frequency offset estimating range regulated by the estimated frequency of the direct wave based on the determined average distortion amount;

a window signal power operating step of determining window signal powers of all frequency offset candidates in the frequency offset estimating range by summing the signal powers of the frequency offset candidates in the frequency window with a predetermined frequency width among the determined signal powers; and a second frequency offset estimating step of estimating the frequency offset candidate corresponding to the maximum value of the determined window signal powers as the frequency offset of the radio receiving signal.

10. An automatic frequency control method according to claim 3, further comprising a filtering step of eliminating high frequency components over the cutoff frequency from the radio receiving signal, wherein the frequency offset estimating step is for determining the distortion amounts of the known signals by using the radio receiving signal from which the high frequency components have been eliminated; and the frequency offset eliminating step is for eliminating the estimated frequency offset from the radio receiving signal whose high frequency components have not been eliminated by the filtering step.

11. An automatic frequency control method for controlling the frequency of a radio receiving signal by eliminating frequency offset from the radio receiving signal periodically including a plurality of adjacent known signals, comprising:

a first distortion amount operating step of determining the distortion amounts between the known signals included in the radio receiving signal;

a first frequency offset estimating step of estimating the frequency of the direct wave of the radio receiving signal based on the distortion amounts of the adjacent known signals among the determined distortion amounts;

a first frequency offset eliminating step of eliminating frequency offset corresponding to the estimated frequency of the direct wave from the radio receiving signal;

a second distortion amount operating step of determining the distortion amounts of the known signals included in the radio receiving signal from which the frequency offset has been eliminated;

a second frequency offset estimating step of estimating the center frequency of the Doppler spread of the radio receiving signal based on the distortion amounts between the periodically included known signal blocks among the determined distortion amounts;

a second frequency offset eliminating step of eliminating frequency offset corresponding to the estimated center frequency of the Doppler spread from the radio receiving signal.

12. An automatic frequency control device for controlling the frequency of a digital baseband signal by eliminating frequency offset from the digital baseband signal upon receiving the digital baseband signal outputted from an A/D converter as an input corresponding to a radio receiving signal which periodically includes a plurality of adjacent known signals, wherein a frequency of a direct wave of the radio receiving signal and a center frequency of a Doppler spread of the radio receiving signal are estimated based on the distortion amounts of the adjacent known signals included in the digital baseband signal, and frequency offset is eliminated from the digital baseband signal based on both frequencies.

13. A demodulator, comprising:

a frequency converter circuit for converting a radio receiving signal periodically including a plurality of adjacent known signals into an analog baseband signal;

an A/D converter circuit for converting the analog baseband signal into a digital baseband signal;

a digital signal processing device configured to receive the digital baseband signal generated by the A/D converter circuit as an input, estimate the frequency of the direct wave of the radio receiving signal and the center frequency of the Doppler spread of the radio receiving signal based on the distortion amounts of the known signals included in the inputted digital baseband signal, eliminate frequency offset from the digital baseband signal based on both frequencies, eliminate fading distortion from the digital baseband signal from which the frequency offset has been eliminated, and demodulate the digital baseband signal.

14. A demodulator according to claim 13, wherein the frequency converter circuit has a voltage control oscillation part, which oscillates a local oscillation signal for converting the radio receiving signal into an analog baseband signal, and changes the oscillation frequency of the oscillation signal in accordance with an applied voltage; and the digital signal processing device eliminates frequency offset from the digital baseband signal by applying a voltage in accordance with both of the estimated frequencies to the voltage control oscillation part.

* * * * *